United States Patent
Sawada et al.

(10) Patent No.: US 10,389,354 B2
(45) Date of Patent: Aug. 20, 2019

(54) ELECTROSTATIC DETECTION SENSOR

(71) Applicant: Panasonic Intellectual Property Management Co., Ltd., Osaka (JP)

(72) Inventors: Takateru Sawada, Osaka (JP); Yasuhiro Yamashita, Osaka (JP); Takuma Besshi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/781,699

(22) PCT Filed: Sep. 30, 2016

(86) PCT No.: PCT/JP2016/004418
§ 371 (c)(1),
(2) Date: Jun. 5, 2018

(87) PCT Pub. No.: WO2017/110016
PCT Pub. Date: Jun. 29, 2017

(65) Prior Publication Data
US 2018/0351551 A1    Dec. 6, 2018

(30) Foreign Application Priority Data

Feb. 16, 2016 (JP) .................. 2016-027282

(51) Int. Cl.
*H03K 17/955* (2006.01)
*H03K 17/96* (2006.01)
*G01V 3/08* (2006.01)

(52) U.S. Cl.
CPC ........... *H03K 17/962* (2013.01); *G01V 3/088* (2013.01); *H03K 2017/9602* (2013.01)

(58) Field of Classification Search
CPC ......... H03K 17/962; H03K 2017/9602; G01V 3/088
(Continued)

(56) References Cited

U.S. PATENT DOCUMENTS 7,081,765 B2 * 7/2006 Miyasaka ............ G06K 9/0002
                                              324/663
10,120,519 B2 * 11/2018 Sawada .................. H01H 36/00
(Continued)

FOREIGN PATENT DOCUMENTS

JP    2004-340662    12/2004
JP    2013-113626    6/2013

OTHER PUBLICATIONS

International Search Report of PCT application No. PCT/JP2016/004418 dated Dec. 6, 2016.

*Primary Examiner* — Ryan Jager
(74) *Attorney, Agent, or Firm* — Greenblum & Bernstein, P.L.C.

(57) ABSTRACT

The electrostatic detection sensor has a first electrode, a second electrode, and a third electrode. A controller connects the first electrode and the second electrode, and applies a first drive voltage thereto to obtain a first intensity. The controller applies a second drive voltage to the first electrode while keeping the second electrode and the third electrode at a ground potential to obtain a second intensity. The controller applies a third drive voltage to the third electrode while grounding the first electrode to the ground potential and keeping the second electrode open to obtain a third intensity. Then, the controller determines whether an object is approaching based on first, second, and third computed values which are computed temporal changes in the first, second, and third intensities, respectively.

13 Claims, 13 Drawing Sheets

(58) Field of Classification Search
USPC .......................................................... 327/517
See application file for complete search history.

(56) References Cited

U.S. PATENT DOCUMENTS

| | | |
|---|---|---|
| 2005/0001633 A1 | 1/2005 | Okushima et al. |
| 2005/0257628 A1* | 11/2005 | Nikaido ................ B60N 2/002 73/862.541 |
| 2009/0044750 A1* | 2/2009 | Pipitone ................ C23C 14/505 118/712 |
| 2010/0073181 A1* | 3/2010 | Ootaka ................... B60N 2/00 340/667 |
| 2018/0239456 A1* | 8/2018 | Sawada .................. H01H 36/00 |
| 2018/0351551 A1* | 12/2018 | Sawada .................... G01V 3/08 |

* cited by examiner

ELECTROSTATIC DETECTION SENSOR

CROSS-REFERENCE TO RELATED APPLICATIONS

This application is a U.S. national stage application of the PCT International Application No. PCT/JP2016/004418 filed on Sep. 30, 2016, which claims the benefit of foreign priority of Japanese patent application No. 2015-250138, 2016-027282 filed on Dec. 22, 2015, Feb. 16, 2016, the contents all of which are incorporated herein by reference.

TECHNICAL FIELD

The present invention relates to an electrostatic detection sensor mounted to, for example, vehicles or various electronic devices.

BACKGROUND ART

Proposals for mounting an electrostatic detection sensor to vehicles or various electronic devices and enabling a predetermined operation based on the detection result of the electrostatic detection sensor have been increasing. PTL 1 discloses a configuration provided with a door handle mounted to be movable relative to a vehicle body of a vehicle, wherein an electrostatic detection sensor is provided inside a housing of the handle.

FIG. 7 is a plan view of the conventional electrostatic detection sensor disclosed in PTL 1. FIG. 8 is a diagram illustrating a detection flow of the electrostatic detection sensor. The electrostatic detection sensor includes rectangular first electrode 1, and second electrode 2 which linearly surrounds the periphery of first electrode 1 with a space therebetween, as illustrated in FIG. 7. A user performs an operation by touching a position according to the sensor body by his/her finger or the like. With this operation, capacitance formed between first and second electrodes 1 and 2 and a neighboring conductor is changed. PTL 1 discloses a configuration in which a controller, which is not illustrated, sequentially performs processes from step S101 to step S107 in a detection flow illustrated in FIG. 8 to detect an operating state based on a change in the capacitance.

Further, conventional electrostatic detection sensors include one provided to be exposed on a surface of a vehicle body of a vehicle (see PTL 2, for example). Such an electrostatic detection sensor includes a sensor case, a detection electrode, a touch electrode, a detection electrode for difference correction, a touch electrode for difference correction, a detection circuit, and other components. The detection electrode is disposed on an inner surface of a front surface of the sensor case. The touch electrode is disposed on an outer surface of the front surface. The detection electrode for difference correction is disposed on an inner surface of a side wall of the sensor case. The touch electrode for difference correction is disposed on an outer surface of the side wall. The detection circuit calculates a difference value between a value corresponding to capacitance between the detection electrode and a ground and a value corresponding to capacitance between the detection electrode for difference correction and the ground, and detects a touch of an object to the touch electrode based on a change in the difference value. In addition, a protection portion protruding laterally from the sensor case is provided to the side edge of the front surface of the sensor case so as to prevent water from adhering or flowing in such a way as to continuously cover the vehicle body.

CITATION LIST

Patent Literature

PTL 1: Unexamined Japanese Patent Publication No. 2013-113626
PTL 2: Unexamined Japanese Patent Publication No. 2004-340662

SUMMARY OF THE INVENTION

Meanwhile, a door handle of a vehicle is exposed to water during rainfall or vehicle wash. The water may flow on a housing of the handle, or the water may penetrate the door handle and flow on a sensor body. In such a case, even if a position according to the sensor body is operated by a finger, the sensor may not detect the finger, according to the detection flow of the conventional electrostatic detection sensor illustrated in FIG. 8. The present invention is accomplished to solve the conventional problems described above, and aims to provide an electrostatic detection sensor that can detect a finger or the like with high precision even in a state of being exposed to water.

Moreover, in the configuration of the electrostatic detection sensor disclosed in PTL 2 in which the touch electrode and the touch electrode for difference correction are disposed to be mutually orthogonal, both electrodes are separately provided. Therefore, when vibration or thermal shock is applied to the electrostatic detection sensor, the distance between the touch electrode and the touch electrode for difference correction is changed (the positional relation between both touch electrodes is shifted) due to the vibration or the thermal shock, which may deteriorate the detection precision of the electrostatic detection sensor.

According to another aspect of the technology disclosed in the present specification, the present invention is accomplished in view of the foregoing problems of PTL 2, and aims to improve the detection precision of the electrostatic detection sensor with the distance between the electrodes being kept constant, even when vibration or thermal shock is applied to the electrostatic detection sensor.

The electrostatic detection sensor according to the present disclosure includes the following means. Specifically, the electrostatic detection sensor is provided with: a sensor body which includes a first electrode having a first flat surface, a second electrode which has a second flat surface parallel to the first flat surface and is disposed to surround the first electrode while being separated from the first electrode, and a third electrode which has an outer perimeter surface having a predetermined angle with respect to the second flat surface and is disposed to surround the second electrode while being separated from the second electrode; and a controller connected to the first electrode, the second electrode, and the third electrode. The controller obtains: a first intensity corresponding to capacitance between the first electrode and the second electrode by applying a first drive voltage to the first electrode and the second electrode while connecting the first electrode and the second electrode and keeping the third electrode open; a second intensity corresponding to capacitance of the first electrode by applying a second drive voltage to the first electrode while connecting the second electrode and the third electrode to a ground potential; and a third intensity corresponding to capacitance of the third electrode by applying a third drive voltage to the third electrode while connecting the first electrode to the ground potential and keeping the second electrode open. The controller then determines whether an object approaches the sensor body based on a first computed value which is a computed temporal change in the first intensity, a second computed value which is a computed temporal change in the second intensity, and a third computed value which is a computed temporal change in the third intensity. This electrostatic detection sensor can detect an object which performs an operation with higher precision than the conventional technology.

In addition, according to another aspect of the electrostatic detection sensor in the present disclosure, the sensor body has a substrate on which the first to third electrodes are formed, and a fixing member that fixedly supports the substrate.

The electrostatic detection sensor according to the present disclosure can detect a finger or the like with high precision even in a state of being exposed to water.

According to still another aspect of the electrostatic detection sensor in the present disclosure, the fixing member fixedly supports the substrate, whereby, even if vibration or thermal shock is applied to the electrostatic detection sensor, distances among the first to third electrodes formed on the substrate can be kept constant (the positional relation among the first to third electrodes can be maintained). Therefore, a change in capacitance caused by vibration or thermal shock applied to the electrostatic detection sensor can be reduced, whereby the detection precision of the electrostatic detection sensor can be improved.

DESCRIPTION OF EMBODIMENTS

Figure 1:
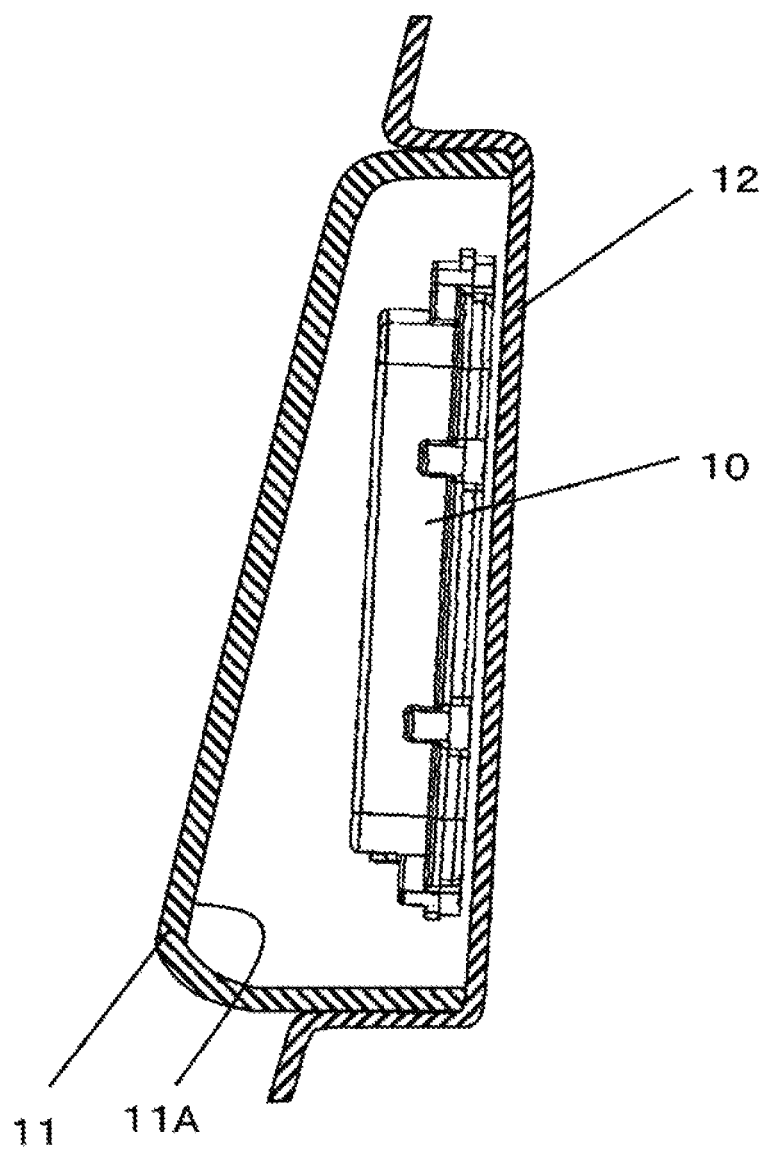
FIG. 1 is a view illustrating an installation state of an electrostatic detection sensor according to a first exemplary embodiment of the present invention.

Hereinafter, an electrostatic detection sensor according to a first exemplary embodiment which is one exemplary embodiment of the present invention will be described with reference to the drawings. FIG. 1 is a view illustrating an installation state of an electrostatic detection sensor according to the first exemplary embodiment where the electrostatic detection sensor is installed inside resin bumper 11. In FIG. 1, reference mark 10 denotes the electrostatic detection sensor, and in the present exemplary embodiment, electrostatic detection sensor 10 is attached to metal body 12 of a trunk door at the rear part of a vehicle body, for example.

For example, when a finger or the like is approaching resin bumper 11, electrostatic detection sensor 10 is sensitive to the approaching finger or the like, so that the trunk door is opened. Because it is difficult to stably fix electrostatic detection sensor 10 to inner surface 11A of resin bumper 11, electrostatic detection sensor 10 is installed on a recessed surface of metal body 12 at the rear part of the vehicle body.

Figure 2:
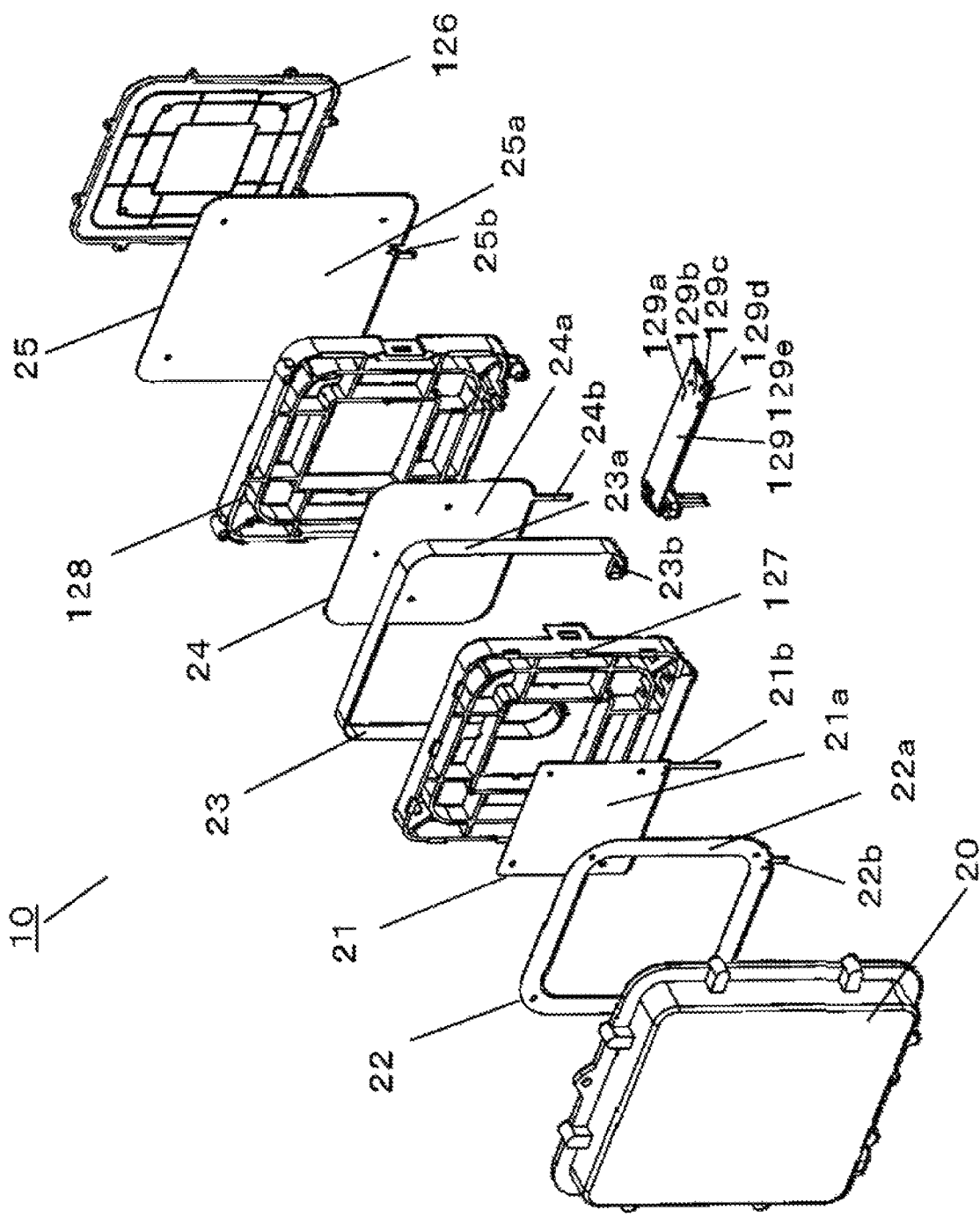
FIG. 2 is an exploded perspective view of the electrostatic detection sensor according to the first exemplary embodiment.

FIG. 2 is an exploded perspective view of the electrostatic detection sensor according to the first exemplary embodiment of the present invention. Electrostatic detection sensor 10 includes front case 20, second electrode 22, first electrode 21, first support member 127, control substrate 129, third electrode 23, fourth electrode 24, second support member 128, fifth electrode 25, and back case 126. First support member 127 made of resin is provided with pins not illustrated, and first electrode 21 and second electrode 22 are each formed with holes on four corners. Pins on first support member 127 are inserted into the holes in first electrode 21 and second electrode 22, and then, the tips of the pins are melted. With this process, first electrode 21 and second electrode 22 are fixedly supported by first support member 127. Similarly, fourth electrode 24 and fifth electrode 25 are fixedly supported by second support member 128. Third electrode 23 is fixedly supported by being fitted to first support member 127 using its own resilient force. Further, first electrode 21, second electrode 22, third electrode 23, fourth electrode 24, and fifth electrode 25 are respectively provided with first leg 21b, second leg 22b, third leg 23b, fourth leg 24b, and fifth leg 25b. Control substrate 129 has first opening 129a, second opening 129b, third opening 129c, fourth opening 129d, and fifth opening 129e. Each of first leg 21b to fifth leg 25b is inserted into corresponding one of first opening 129a to fifth opening 129e and electrically connected.

First electrode 21, second electrode 22, third electrode 23, fourth electrode 24, and fifth electrode 25 are each formed from a metal plate. First electrode 21, fourth electrode 24, and fifth electrode 25 are a flat plate with a rectangular outer shape, and second electrode 22 and third electrode 23 are a frame member with a rectangular outer shape. Third electrode 23 has a shape without having a bottom side of a frame member. Due to the shape without having a bottom side, third electrode 23 having resilience is easy to be fixedly supported by first support member 127.

In the present exemplary embodiment, first electrode 21 and second electrode 22 are fixedly supported by first support member 127 by means of pins. However, other methods may be used, such as a method by bonding or screwing or by means of clips, or a method using special processing such as using a guide. Similarly, to allow fourth electrode 24 and fifth electrode 25 to be fixedly supported by second support member 128, the other methods described above may be used. The same is applied to a method for allowing third electrode 23 to be fixedly supported by first support member 127. Although the present exemplary embodiment describes that outer perimeter surface 23a is perpendicular to second flat surface 22a, outer perimeter surface 23a may have a predetermined angle with respect to second flat surface 22a. The present exemplary embodiment describes that first electrode 21, second electrode 22, third electrode 23, fourth electrode 24, and fifth electrode 25 are formed from a metal plate. However, all or some of them may be formed from other conductive materials such as a flexible printed substrate or a copper foil pattern of a printed substrate.

First electrode 21, second electrode 22, third electrode 23, fourth electrode 24, and fifth electrode 25 respectively have first flat surface 21a, second flat surface 22a, outer perimeter surface 23a, fourth flat surface 24a, and fifth flat surface 25a. First flat surface 21a is parallel to second flat surface 22a, and second electrode 22 is disposed to surround first electrode 21 while being separated from first electrode 21. Outer perimeter surface 23a is perpendicular to second flat surface 22a, and third electrode 23 is disposed to surround second electrode 22 while being separated from second electrode 22.

Fourth flat surface 24a and fifth flat surface 25a are parallel to first flat surface 21a. Fifth electrode 25 is disposed to face a back surface of first flat surface 21a. Fourth electrode 24 is disposed between first flat surface 21a and fifth flat surface 25a.

Fifth electrode 25 is disposed to face the back surface of first flat surface 21a while being constantly grounded. According to the arrangement of fifth electrode 25 as described above, an effect from a back surface side of fifth flat surface 25a, that is, an effect of a change in capacitance due to dirt, water, salt water, or the like accumulated on the back surface side, for example, can be eliminated.

In a case where fifth electrode 25 is provided, fourth electrode 24 is desirably provided between first flat surface 21a and fifth flat surface 25a. This is because, if fifth electrode 25 serving as a ground electrode is provided to be close to first electrode 21, second electrode 22, and third electrode 23, first electrode 21, second electrode 22, and third electrode 23 are affected by fifth electrode 25, by which an electric field does not expand toward front case 20. According to the arrangement of fourth electrode 24 as described above, the effect of fifth electrode 25 can be reduced, which leads to improvement of intensity of electrostatic detection sensor 10. Note that, if electrostatic detection sensor 10 is installed such that dirt, water, salt water, or the like is not accumulated on the back surface of electrostatic detection sensor 10, fourth electrode 24 and fifth electrode 25 may not be provided.

The outer shapes of first electrode 21, fourth electrode 24, and fifth electrode 25 are not limited to be rectangle, and may be a circle, an ellipse, or a rectangle with rounded corners, for example. The outer shapes of second electrode 22 and third electrode 23 may be changed according to the outer shape of first electrode 21. However, second electrode 22 needs to be disposed while being separated from first electrode 21 with a constant space. In addition, while second electrode 22 is a frame member in the above description, second electrode 22 may have a shape without having a bottom side of a frame member in the first exemplary embodiment, because second electrode 22 having such a shape provides a function equivalent to the function of second electrode 22 which is a frame member. For the same reason, third electrode 23 may have a shape of a frame member having a bottom side. In the above description, second electrode 22 is disposed to surround first electrode 21. However, it is unnecessary for second electrode 22 to entirely surround first electrode 21. Second electrode 22 may be disposed along the outer perimeter of first electrode 21. The relationship between third electrode 23 and second electrode 22 is the same as described above.

Figure 3:
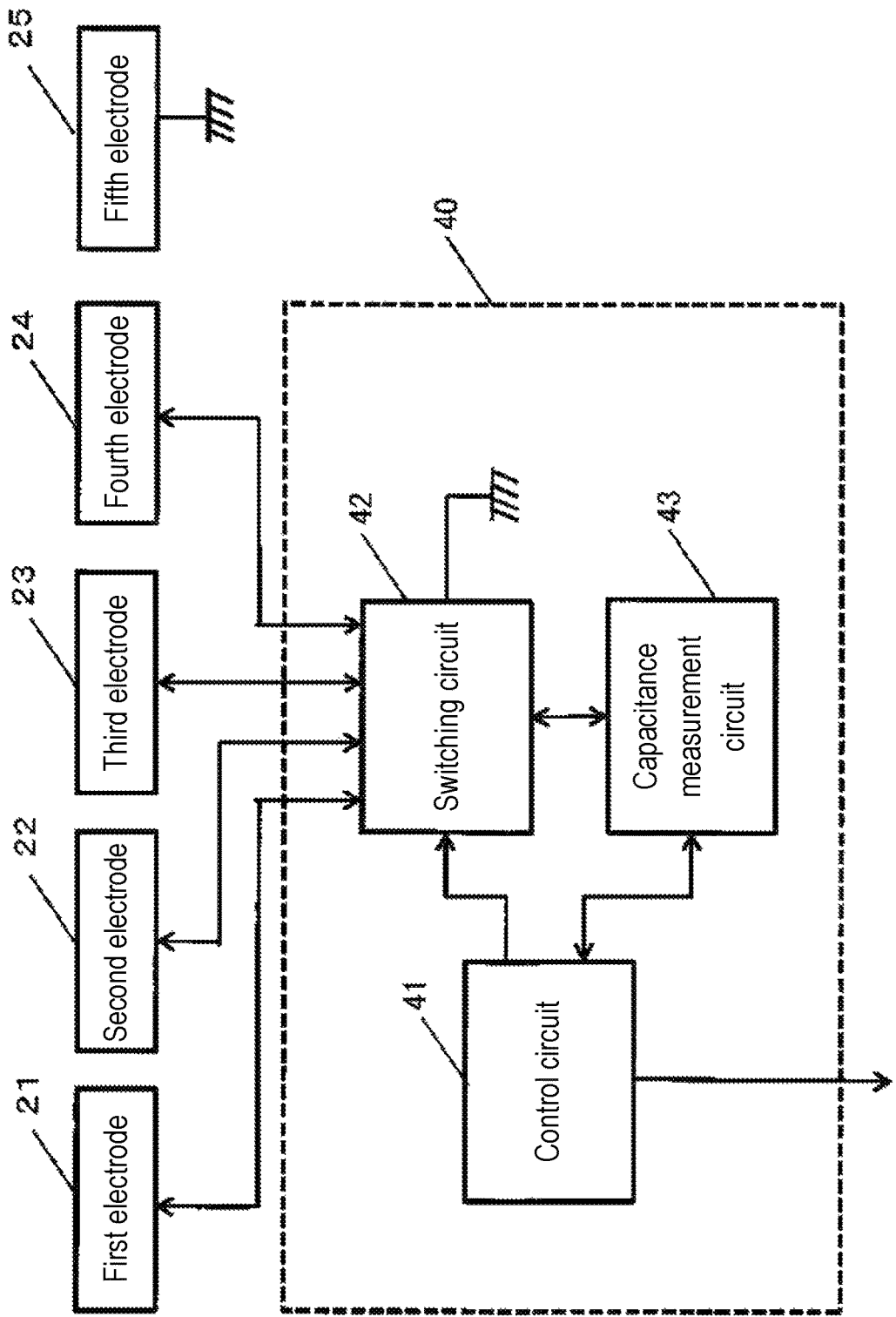
FIG. 3 is a block diagram illustrating a connection state between the electrostatic detection sensor according to the first exemplary embodiment and a controller.

FIG. 3 is a block diagram illustrating a connection state between controller 40 and first electrode 21 to fourth electrode 24 of electrostatic detection sensor 10. First electrode 21 to fourth electrode 24 are each connected to controller 40 mounted on control substrate 129. Further, as described in a second exemplary embodiment stated later, first electrode 21 to fourth electrode 24 are electrically connected to controller 40 mounted on a back surface of ground substrate 28, and third electrode 23 of first printed substrate 26 and third electrode 23 on second printed substrate 27 are electrically connected to each other. Fifth electrode 25 is constantly grounded. Controller 40 applies a drive voltage to first electrode 21 to fourth electrode 24 to detect a change in capacitance of first electrode 21 to third electrode 23. Controller 40 includes control circuit 41, switching circuit 42, and capacitance measurement circuit 43.

Control circuit 41 controls switching circuit 42 and capacitance measurement circuit 43. Switching circuit 42 selects an electrode for which capacitance is to be measured according to a measurement condition (this condition will be described later) for measuring capacitance. Capacitance measurement circuit 43 measures the capacitance of the selected electrode. Control circuit 41 has incorporated therein a computing circuit which performs a predetermined computing process for the measured capacitance value and outputs a signal according to the result of the computing process. This signal is transmitted to a body-side device not illustrated. A microcomputer in control circuit 41 stores a program executed in a later-described flow illustrated in FIG. 4.

Next, an operation of electrostatic detection sensor 10 will be described. When a finger or the like approaches resin bumper 11, a change in capacitance occurs in first electrode 21 to third electrode 23 according to measurement conditions. Controller 40 detects the change in capacitance to make an operation determination for determining whether an operation for opening the trunk door is to be performed. The process for the operation determination will be described with reference to FIG. 4.

Figure 4:
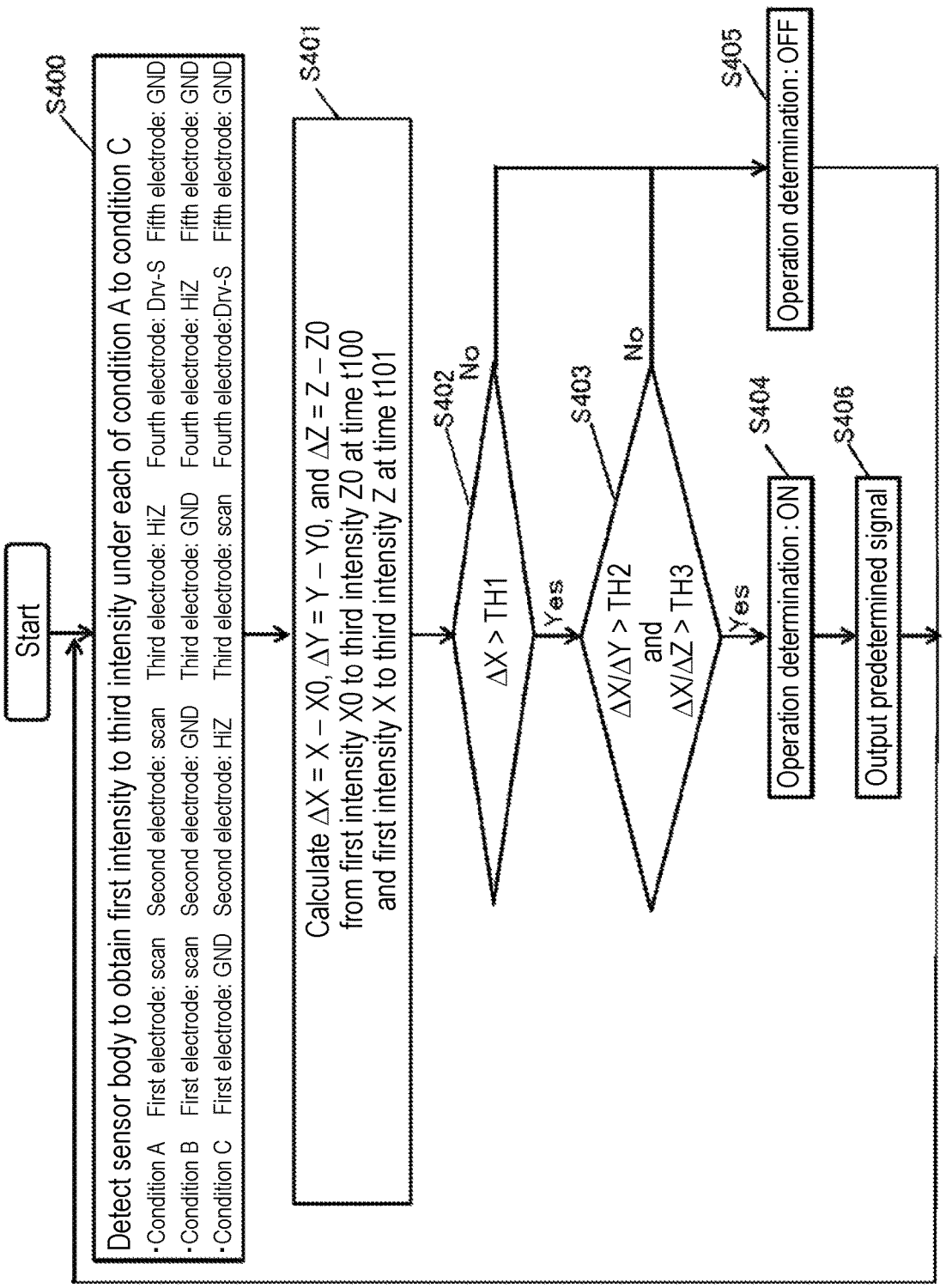
FIG. 4 is a diagram illustrating a detection flow of the electrostatic detection sensor according to the first exemplary embodiment.

FIG. 4 is a diagram illustrating a detection flow of electrostatic detection sensor 10. Control circuit 41 in controller 40 performs the operation illustrated in FIG. 4. Control circuit 41 performs the operation illustrated in FIG. 4 at a predetermined time interval (for example, 50-millisecond intervals). The operation in FIG. 4 is repeatedly executed even in a non-operated state where an object such as a finger does not approach electrostatic detection sensor 10.

Firstly, in step S400 in FIG. 4, control circuit 41 obtains a intensity for each of three types of measurement conditions A to C. Specifically, under condition A, control circuit 41 switches switching circuit 42 to electrically connect first electrode 21 and second electrode 22, and applies a first drive voltage to first electrode 21 and second electrode 22 (in the following description, applying a drive voltage to an electrode is also referred to as "scanning") while keeping third electrode 23 open (this state is indicated as "HiZ" in FIG. 4). Then, control circuit 41 obtains, from capacitance measurement circuit 43, a first intensity corresponding to the capacitance between first electrode 21 and second electrode 22 which are electrically connected to each other. The first intensity is obtained for determining whether there is an object approaching electrostatic detection sensor 10.

When the first drive voltage is applied to first electrode 21 and second electrode 22, an electric field is greatly expanded, whereby a detection distance of electrostatic detection sensor 10 is increased. Thus, a change in capacitance caused by a finger or water approaching from a distance can be detected. Further, under condition A, a waveform voltage having a same potential and a same phase for first electrode 21 and second electrode 22 is applied to fourth electrode 24. In FIG. 4, a state where a waveform voltage having the same potential and the same phase for first electrode 21, second electrode 22, or third electrode 23 is applied to fourth electrode 24 is indicated as "Drv-S". When fourth electrode 24 is set at a potential same as the potential of first electrode 21 and second electrode 22 as described above, the effect of fifth electrode 25 connected to a ground (indicated as "GND" in FIG. 4) can be suppressed, whereby the detection distance of electrostatic detection sensor 10 can be increased.

Under condition B, control circuit 41 connects second electrode 22 and third electrode 23 to the ground potential, and applies a second drive voltage to first electrode 21, thereby obtaining a second intensity corresponding to the capacitance of first electrode 21. In addition, under condition B, control circuit 41 keeps fourth electrode 24 open. The second intensity is obtained in a state where second electrode 22 and third electrode 23 are set at the ground potential, and thus, the second intensity enables active detection of a change in capacitance, caused by adhered conductive materials, for example, caused by water, at a portion near first electrode 21, that is, at a portion corresponding to the vicinity of the central part of electrostatic detection sensor 10 on the surface of resin bumper 11.

Under condition C, control circuit 41 connects first electrode 21 to the ground potential, and applies a third drive voltage to third electrode 23 while keeping second electrode 22 open, thereby obtaining a third intensity corresponding to the capacitance of third electrode 23. Further, under condition C, a waveform voltage having a same potential and a same phase for third electrode 23 is applied to fourth electrode 24. The third intensity is obtained in a state where first electrode 21 is set at the ground potential and second electrode 22 is open, and thus, the third intensity enables active detection of a change in capacitance, caused by adhered conductive materials, for example, caused by water, at a portion near third electrode 23, that is, at a portion corresponding to the vicinity of the peripheral part of electrostatic detection sensor 10 on the surface of resin bumper 11.

Note that, under condition B and condition C, the control for fourth electrode 24 is not limited to the control in the present exemplary embodiment. For example, under condition B or condition C, fourth electrode 24 may be connected to the ground potential so as to obtain an optimum electric field according to the size and position of first electrode 21 to fifth electrode 25. The operation for obtaining the first to third intensities is not necessarily always executed, but may be selectively executed in consideration of power consumption and the precision in the operation determination executed in step S403 described later. For example, it is considered that the operation for obtaining the first intensity is constantly executed, and the operation for obtaining the second intensity and the operation for obtaining the third intensity are alternately executed. In this case, power used in step S400 can be suppressed.

Next, control circuit 41 performs the process in step S401. Specifically, control circuit 41 obtains a difference value between three types of intensities which are first intensity X, second intensity Y, and third intensity Z detected at current time t101 and three types of intensities which are first intensity X0, second intensity Y0, and third intensity Z0 detected at time t100 which is 500 milliseconds before time t101, for example. Specifically, control circuit 41 calculates, based on first intensity X and first intensity X0, first computed value $\Delta X$ ($=X-X0$) which is a difference value between both intensities. Control circuit 41 also calculates, based on second intensity Y and second intensity Y0, second computed value $\Delta Y$ ($=Y-Y0$) which is a difference value between both intensities. Similarly, control circuit 41 calculates, based on third intensity Z and third intensity Z0, third computed value $\Delta Z$ ($=Z-Z0$) which is a difference value between both intensities. The respective computed values may be obtained by reversing the order of intensities in each equation. That is, first computed value $\Delta X$ may be $\Delta X=X0-X$, and similarly, second computed value $\Delta Y$ may be $\Delta Y=Y0-Y$, and third computed value $\Delta Z$ may be $\Delta Z=Z0-Z$. Note that the time interval between time t100 to time t101 is not limited to be 500 milliseconds.

Subsequently, control circuit 41 determines whether there is an object approaching resin bumper 11 in step S402. That is, control circuit 41 compares first computed value $\Delta X$ to first threshold TH1 set in advance. When first computed value $\Delta X$ is equal to or smaller than first threshold TH1 ("No" in step S402), control circuit 41 determines that there is no object such as a finger or water and electrostatic detection sensor 10 is in a non-operated state (operation determination: OFF) (step S405), and then, returns to step S400. When first computed value $\Delta X$ is larger than preset first threshold TH1, control circuit 41 determines in step S402 that an operation instruction is issued by an approaching finger or the like or water splashes, and then, proceeds to step S403. In step S403, control circuit 41 performs determination of whether the change in capacitance is caused by an operation instruction by an approaching finger or the like or caused by water which is an external factor.

In step S403, control circuit 41 compares the ratio of first computed value $\Delta X$ to second computed value $\Delta Y$, that is, fourth computed value $\Delta X/\Delta Y$, with preset second threshold TH2. Control circuit 41 also compares, in step S403, the ratio of first computed value $\Delta X$ to third computed value $\Delta Z$, that is, fifth computed value $\Delta X/\Delta Z$, with preset third threshold TH3. If fourth computed value $\Delta X/\Delta Y$ is larger than second threshold TH2 and fifth computed value $\Delta X/\Delta Z$ is larger than third threshold TH3 in step S403, control circuit 41 determines that the operation determination is ON (step S404). That is, in this case, control circuit 41 determines that electrostatic detection sensor 10 is currently operated by a finger or the like, and outputs a predetermined signal to the body-side device (step S406). The body-side device receiving the predetermined signal performs an operation such as an operation for unlocking the trunk door.

In the detection flow in FIG. 4, the operation determination is performed based on both the comparison result between fourth computed value $\Delta X/\Delta Y$ and second threshold TH2 and the comparison result between fifth computed value $\Delta X/\Delta Z$ and third threshold TH3. This is to enhance precision in the operation determination by comprehensively detecting a change in capacitance in entire electrostatic detection sensor 10 during the operation determination. A change in capacitance for entire electrostatic detection sensor 10 by a finger, water, or the like is measured based on first computed value $\Delta X$ which is obtained by scanning first electrode 21 and second electrode 22 that are connected to each other. On the contrary, based on second computed value $\Delta Y$ and third computed value $\Delta Z$, only a change in capacitance near first electrode 21 due to water and only a change in capacitance near third electrode 23 due to water are measured respectively.

Therefore, a change in capacitance near first electrode 21 is detected through comparison between fourth computed value ΔX/ΔY and second threshold TH2, and a change in capacitance near third electrode 23 is detected through comparison between fifth computed value ΔX/ΔZ and third threshold TH3. By using both comparison results for the operation determination, the operation determination for whole electrostatic detection sensor 10 can be precisely performed.

More specifically, when the periphery of first electrode 21 is splashed with water, second computed value ΔY increases, and fourth computed value ΔX/ΔY decreases. If fourth computed value ΔX/ΔY is equal to or smaller than second threshold TH2, control circuit 41 determines that the change in capacitance is not caused by an operation instruction by a finger or the like but caused by water which is an external factor, and sets "operation determination: OFF" in step S405. When the periphery of third electrode 23 is splashed with water, third computed value ΔZ increases, and fifth computed value ΔX/ΔZ decreases. If fifth computed value ΔX/ΔZ is equal to or smaller than third threshold TH3, controller 40 determines that the change in capacitance is not caused by an operation instruction by a finger or the like but caused by water which is an external factor, and sets "operation determination: OFF" in step S405. When fourth computed value ΔX/ΔY is larger than second threshold TH2, and fifth computed value ΔX/ΔZ is larger than third threshold TH3, controller 40 determines that the change in capacitance is caused by an operation instruction by an approaching finger or the like, and thus, sets "operation determination: ON" in step S404, and transmits a predetermined signal to the body-side device in step S406. According to the steps described above, controller 40 distinguishes an operation instruction by an approaching finger or the like and an environmental factor such as water, and only when the operation instruction is issued, controller 40 unlocks the trunk door.

Controller 40 performs the operation determination with the flow described above. The reason why this flow is applied will be described below. Capacitance detected by controller 40 includes a capacitance change in a capacitance value depending on an environment. The capacitance change depending on an environment is caused by, for example, water droplets staying on the surface of electrostatic detection sensor 10, a state of a water film, and an ambient temperature. Capacitance detected by controller 40 also includes a capacitance change in a capacitance value depending on water present on a short-term basis. The capacitance change depending on water present on a short-term basis is caused by, for example, appearance or disappearance of a route to the ground generated by water flowing on the surface of electrostatic detection sensor 10.

In the detection flow described above, a capacitance change value from previous time t100 to current time t101 is observed for detecting, with high precision, a capacitance change excluding the capacitance change depending on an environment and the capacitance change depending on water present on a short-term basis. That is, the operation determination is performed by using first computed value ΔX, second computed value ΔY, and third computed value ΔZ. Consequently, the capacitance change depending on an environment and the capacitance change depending on water present on a short-term basis can be excluded, whereby the precision in the operation determination can be improved.

The reason why the result of the operation determination can be obtained with high precision by using first computed value ΔX, second computed value ΔY, and third computed value ΔZ will be described with reference to FIG. 5.

Figure 5:
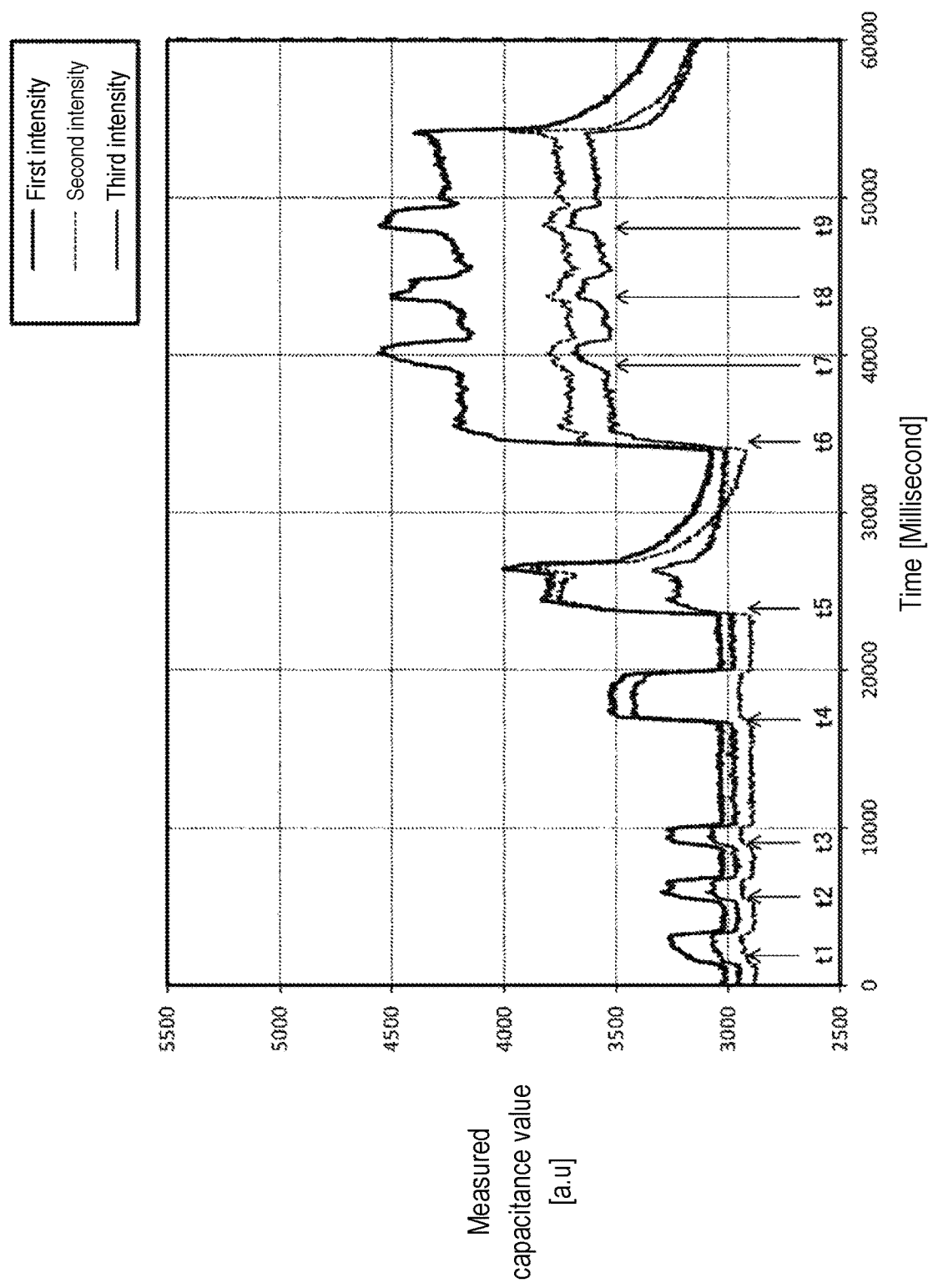
FIG. 5 is a diagram illustrating a change in a capacitance value of the electrostatic detection sensor according to the first exemplary embodiment with time.

FIG. 5 is a diagram illustrating a change in a capacitance value with time when an operator places his/her hand over resin bumper 11. In FIG. 5, a horizontal axis indicates a time, and a vertical axis indicates a measured capacitance value ("a.u" is used as an arbitrary unit). FIG. 5 also illustrates measured capacitance values corresponding to the first to third intensities obtained under conditions A to C by a bold solid line, a dotted line, and a thin line, respectively.

Region 1 (from 0 milliseconds to 10000 milliseconds) shows the result when the operator places his/her hand over dry resin bumper 11 three times. In region 1, the first intensity is higher than the second intensity and the third intensity. Region 2 (from 15000 milliseconds to 20000 milliseconds) shows the result when the portion of resin bumper 11 corresponding to the peripheral part of electrostatic detection sensor 10 is splashed with water. In region 2, the first intensity and the third intensity are higher than the second intensity. Region 3 (from 23000 milliseconds to 36000 milliseconds) shows the result when the portion of resin bumper 11 corresponding to the central part of electrostatic detection sensor 10 is splashed with water. In region 3, the first intensity and the second intensity are higher than the third intensity. Region 4 (from 36000 milliseconds to 39000 milliseconds) shows the result when the portion of resin bumper 11 corresponding to whole (peripheral part and central part of) electrostatic detection sensor 10 is splashed with water. In region 4, the first to third intensities are all high. Region 5 (from 39000 milliseconds to 50000 milliseconds) shows the result when the operator places his/her hand over resin bumper 11 three times in the state where the portion of resin bumper 11 corresponding to whole electrostatic detection sensor 10 is splashed with water. In region 5, the first to third intensities are all high, and particularly, the first intensity is significantly high.

In the detection flow in FIG. 4, after determining whether an object is approaching or not by using first computed value ΔX in step S402, controller 40 performs the determination using fourth computed value ΔX/ΔY and fifth computed value ΔX/ΔZ in step S403. In step S403, controller 40 identifies whether the approaching object is a finger or the like for issuing the operation instruction or an environmental factor such as water.

According to the process described above, controller 40 can distinguish between an operation instruction by a finger or the like and an environmental factor such as water. Therefore, even when whole electrostatic detection sensor 10 is splashed with water, a signal of "operation determination: ON" is transmitted to the body-side device in step S406 when the operator approaches his/her finger toward electrostatic detection sensor 10.

Figure 6:
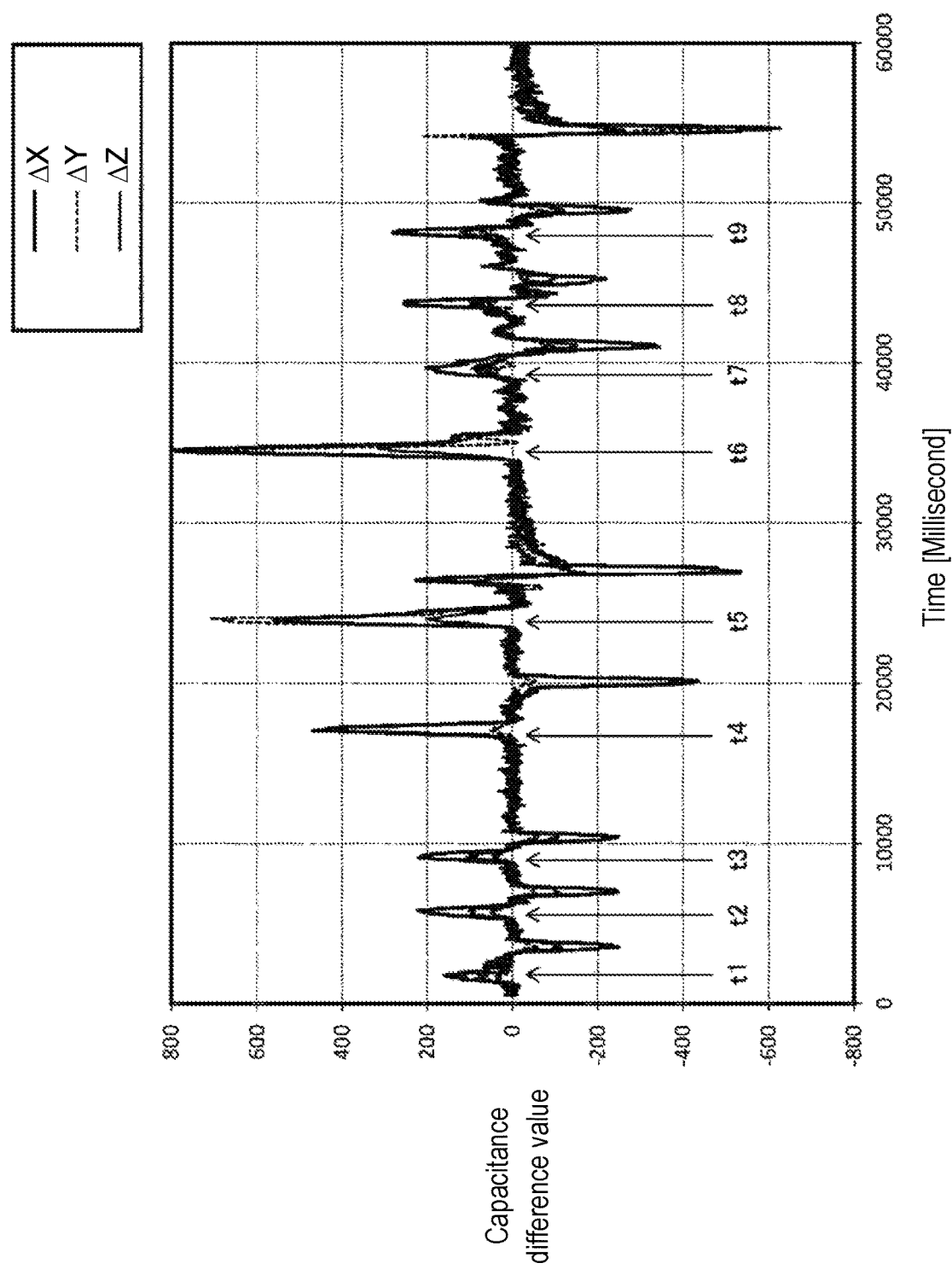
FIG. 6 is a diagram illustrating a change in capacitance difference values of the electrostatic detection sensor according to the first exemplary embodiment with time.
Figure 7:
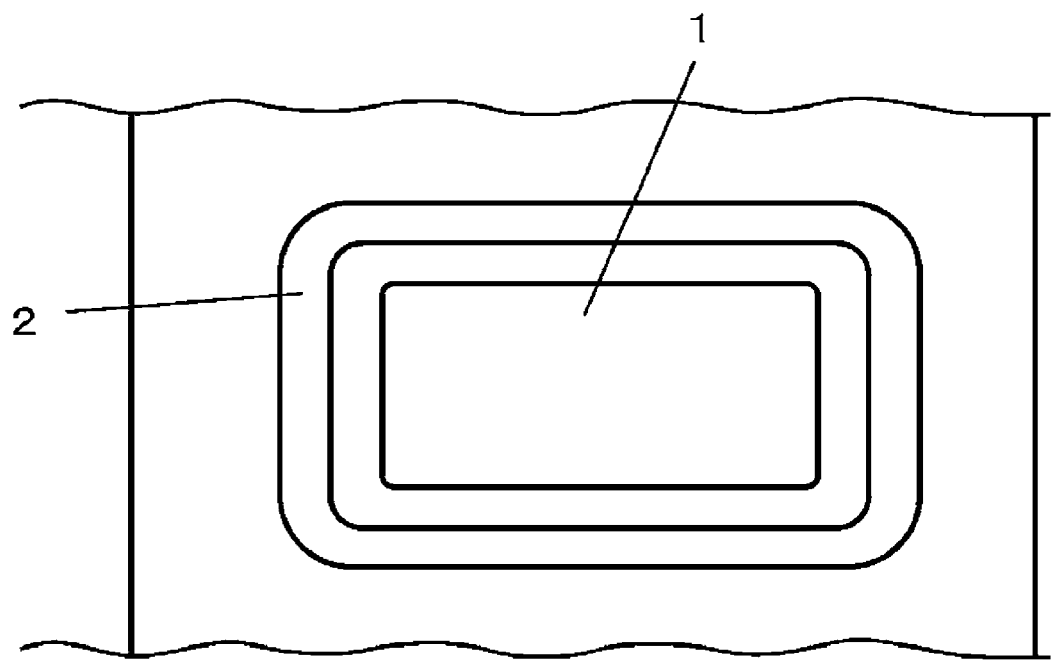
FIG. 7 is a plan view of a conventional electrostatic detection sensor.
Figure 8:
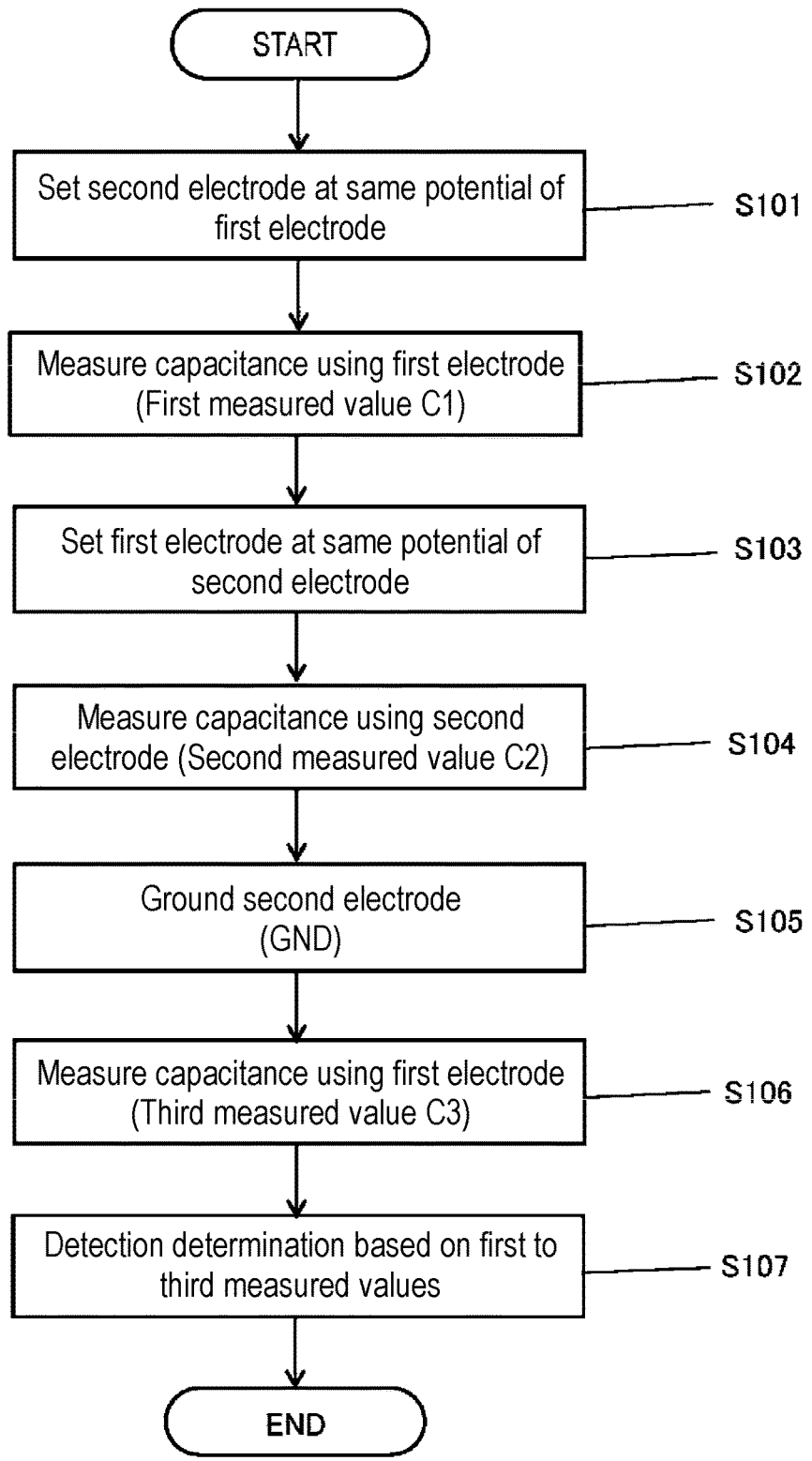
FIG. 8 is a diagram illustrating a detection flow of the conventional electrostatic detection sensor.

FIG. 6 is a diagram illustrating a capacitance difference value with time. In FIG. 6, a horizontal axis indicates a time, and a vertical axis indicates a capacitance difference value (an arbitrary unit is used). Times t1 to t9 in FIG. 6 correspond to times t1 to t9 in FIG. 5.

In step S402, first threshold TH1 can be set to be 100, for example, such that, when the operator places his/her hand over dry resin bumper 11, first computed value ΔX (capacitance difference value) becomes larger than first threshold TH1.

In step S403, first computed value ΔX is large with respect to second computed value ΔY and third computed value ΔZ in region 1 where the operator places his/her hand over dry resin bumper 11 three times. In region 2 where the portion corresponding to the peripheral part of electrostatic detection sensor 10 is splashed with water, first computed value $\Delta X$ is large with respect to second computed value $\Delta Y$. In region 3 where the portion corresponding to the central part of electrostatic detection sensor 10 is splashed with water, first computed value $\Delta X$ is large with respect to third computed value $\Delta Z$. In region 4 where the portion corresponding to whole electrostatic detection sensor 10 is splashed with water, first computed value $\Delta X$ is large with respect to second computed value $\Delta Y$. In region 5 where the operator places his/her hand over resin bumper 11 three times while resin bumper 11 is splashed with water, first computed value $\Delta X$ is large with respect to second computed value $\Delta Y$ and third computed value $\Delta Z$.

Therefore, controller 40 determines in step S403 that electrostatic detection sensor 10 is in a non-operated state (operation determination: OFF) in regions 2 to 4, and returns to step S400. In other words, in regions 1 and 5, second threshold TH2 is set such that fourth computed value $\Delta X/\Delta Y$ becomes larger than second threshold TH2, and third threshold TH3 is set such that fifth computed value $\Delta X/\Delta Z$ becomes larger than third threshold TH3, respectively. Thus, when the operator places his/her hand over resin bumper 11 while resin bumper 11 is splashed with water, first computed value $\Delta X$ is larger than second computed value $\Delta Y$ and third computed value $\Delta Z$ as described above. Therefore, if Yes determination is made in step S403, an approach of hand can be detected even if water is present.

As described above, in the detection flow illustrated in FIG. 4, the effect of the change in a capacitance value due to an environment and an effect of the change in a capacitance value depending on water present on a short-term basis are suppressed, and an object such as a finger can be detected with high precision even in a state where electrostatic detection sensor 10 is exposed to water.

Note that an object which performs an operation includes a human body such as a hand or an elbow, in addition to a finger. In addition, even when the hands of the operator are full, the operator can open the trunk door, a sliding door, and the like with his/her foot. Further, the object may be a thing, other than those described above, which causes a change in a capacitance value of the sensor body.

First electrode 21 may be at least disposed to be stored in second electrode 22 while being separated therefrom with a predetermined space. The arrangement relation between second electrode 22 and third electrode 23 may be such that at least second flat surface 22a of second electrode 22 and outer perimeter surface 23a of third electrode 23 have a predetermined angle with respect to each other.

In the present exemplary embodiment, electrostatic detection sensor 10 is provided inside of resin bumper 11. However, electrostatic detection sensor 10 may be applied to components other than resin bumper 11. For example, electrostatic detection sensor 10 may be mounted to a door handle of a vehicle, or to various electronic devices other than vehicles. Particularly, electrostatic detection sensor 10 can detect an object which performs an operation with high precision even in a state of being splashed with water. Therefore, electrostatic detection sensor 10 is particularly effective when being used for a portion which is likely to be splashed with water. For example, electrostatic detection sensor 10 may be mounted to home electric appliances such as washing machines, portable information communication devices or information terminal devices, various electronic devices such as cameras, or housing-related materials such as an entrance door.

Hereinafter, a second exemplary embodiment will be described in detail with reference to the drawings. In the description below, the components having functions same as the functions of the components in the first exemplary embodiment are denoted by the same reference marks, and the redundant description may be omitted.

Second Exemplary Embodiment

Figure 9:
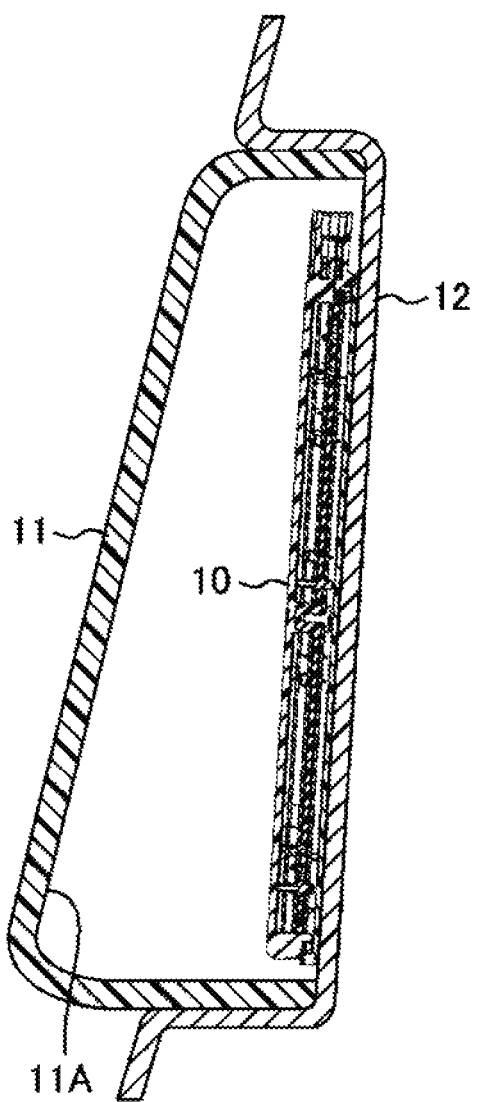
FIG. 9 is a view illustrating an installation state of an electrostatic detection sensor according to a second exemplary embodiment of the present invention.

FIG. 9 is a view illustrating an installation state where electrostatic detection sensor 10 according to the second exemplary embodiment is installed inside resin bumper 11 on a trunk door at the rear part of a vehicle body. Electrostatic detection sensor 10 is mounted on, for example, a recessed surface formed on metal body 12 of the trunk door so as to be recessed toward the front of the vehicle body. The reason why electrostatic detection sensor 10 is installed on metal body 12 is because it is difficult to stably fix electrostatic detection sensor 10 on inner surface 11A of resin bumper 11. When an operator approaches his/her finger or the like toward resin bumper 11, electrostatic detection sensor 10 is sensitive to the approaching finger or the like, and the trunk door is opened.

Figure 10:
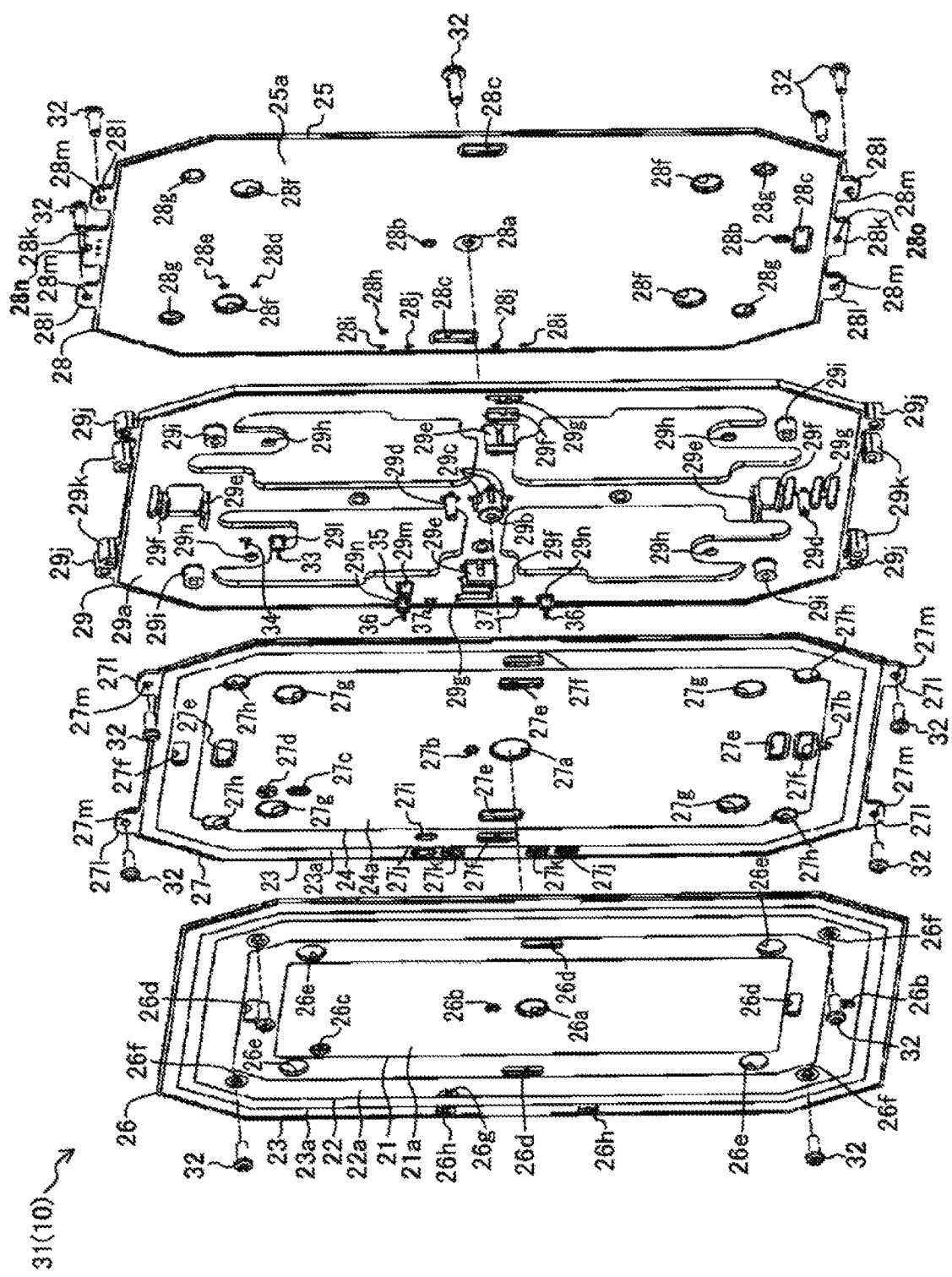
FIG. 10 is an exploded perspective view of the electrostatic detection sensor according to the second exemplary embodiment.
Figure 11:
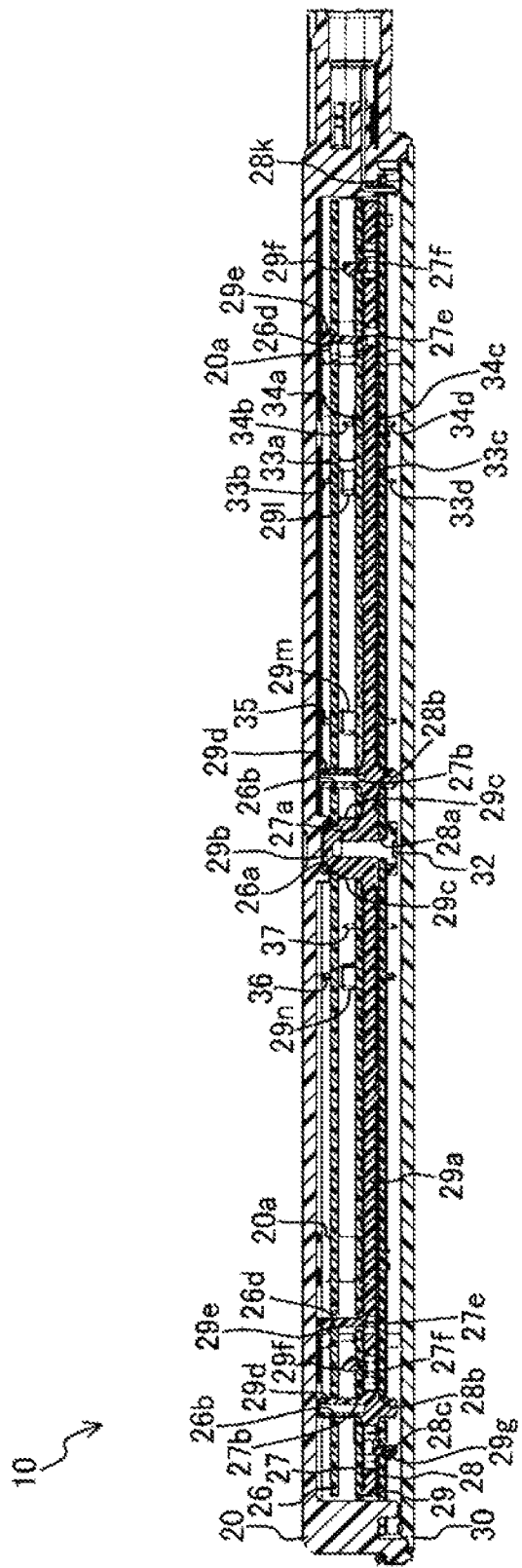
FIG. 11 is a sectional view of the electrostatic detection sensor according to the second exemplary embodiment.

FIG. 10 is an exploded perspective view of electrostatic detection sensor 10. FIG. 11 is a sectional view of electrostatic detection sensor 10. Electrostatic detection sensor 10 includes front case 20, first electrode 21 to fifth electrode 25, first printed substrate 26 (first substrate), second printed substrate 27 (second substrate, fourth electrode substrate), ground substrate 28 (fifth electrode substrate), holder 29 (fixing member), back cover 30, controller 40 (illustrated only in FIG. 3), and the like. First electrode 21 to fifth electrode 25, first printed substrate 26, second printed substrate 27, ground substrate 28, holder 29, and controller 40 constitute sensor body 31.

In the following description, for the sake of convenience of easy understanding of the description, "top", "bottom", "left", and "right" in FIG. 10 respectively correspond to the "top", "bottom", "left", and "right" of electrostatic detection sensor 10. FIG. 11 illustrates electrostatic detection sensor 10 which is cut at right angles to the lateral direction thereof.

Second electrode 22 is disposed to surround the entire periphery of first electrode 21 while being separated from first electrode 21 at substantially equal spaces. Third electrode 23 on first printed substrate 26 is disposed to surround the entire periphery of second electrode 22 while being separated from second electrode 22 at substantially equal spaces. Third electrode 23 on second printed substrate 27 is disposed to surround the entire periphery of second electrode 22 while being separated from second electrode 22 at substantially equal spaces as viewed from the thickness direction of first printed substrate 26 and second printed substrate 27, that is, an arraying direction of first printed substrate 26, second printed substrate 27, and ground substrate 28 (this arraying direction is referred to as "substrate arraying direction" below). Third electrode 23 on second printed substrate 27 is disposed to surround the entire periphery of fourth electrode 24 while being separated from fourth electrode 24 at substantially equal spaces.

Fourth electrode 24 is disposed between first electrode 21 and fifth electrode 25. Fifth electrode 25 is a ground electrode which is constantly grounded. Fifth electrode 25 is disposed on a back surface side of first electrode 21 so as to correspond to first electrode 21 (so as to be overlapped with first electrode 21 as viewed from the substrate arraying direction). According to the arrangement of fifth electrode 25 as described above, an effect from a back surface side of fifth electrode 25, that is, an effect of a change in capacitance due to dirt, water, salt water, or the like accumulated on the back surface side, for example, can be suppressed.

Meanwhile, in a case where fifth electrode 25 serving as a ground electrode is provided to be close to first electrode 21, second electrode 22, and third electrode 23, first electrode 21, second electrode 22, and third electrode 23 are affected by fifth electrode 25, by which an electric field does not expand toward front case 20, unless fourth electrode 24 is provided. Therefore, according to the arrangement of fourth electrode 24 as described above, the effect of fifth electrode 25 can be reduced, which leads to improvement of intensity of electrostatic detection sensor 10. Note that, if electrostatic detection sensor 10 is installed such that dirt, water, salt water, or the like is not accumulated on the back surface side, fourth electrode 24 and fifth electrode 25 may not be provided.

First electrode 21 to fifth electrode 25 are a copper foil pattern. First electrode 21 is formed into a rectangle which is vertically long. Fourth electrode 24 and fifth electrode 25 are formed to have a shape in which four corners of a vertically long rectangle are cut in a triangular shape. Fourth electrode 24 is formed to be larger than first electrode 21 as viewed from the substrate arraying direction. Fifth electrode 25 is formed to be larger than fourth electrode 24 as viewed from the substrate arraying direction. Second electrode 22 and third electrode 23 are formed into a frame shape substantially equal to the outer shape of fourth electrode 24 and fifth electrode 25.

First electrode 21 to fifth electrode 25 have first flat surface 21a to fifth flat surface 25a, respectively. Second flat surface 22a to fifth flat surface 25a are parallel to first flat surface 21a.

Front case 20, first printed substrate 26, second printed substrate 27, holder 29, ground substrate 28, and back cover 30 are arrayed in this order in the substrate arraying direction so as to be overlapped with one another. Front case 20 is formed into a box shape having substantially a rectangular shape which is vertically long. First printed substrate 26, second printed substrate 27, ground substrate 28, holder 29, and back cover 30 are formed into a shape in which four corners of a vertically long rectangle are cut into a triangular shape. Front case 20 and back cover 30 are formed to be larger than first printed substrate 26, second printed substrate 27, ground substrate 28, and holder 29 as viewed from the substrate arraying direction. First printed substrate 26, second printed substrate 27, ground substrate 28, and holder 29 are formed to have substantially the same size as viewed from the substrate arraying direction.

First electrode 21 is formed on a central part of a surface (surface facing inner surface 11A of resin bumper 11 in FIG. 9, surface which is shown in FIG. 10) of first printed substrate 26. Third electrode 23 is formed on an outer perimeter edge of the surface of first printed substrate 26. Second electrode 22 is formed between first electrode 21 and third electrode 23 on the surface of first printed substrate 26. That is, first flat surface 21a to third flat surface 23a of first electrode 21 to third electrode 23 on first printed substrate 26 are on the same plane. Note that first flat surface 21a to third flat surface 23a may be on different planes, so long as they are parallel to one another.

Boss insertion hole 26a is formed in first printed substrate 26 at a central part of an area where first electrode 21 is formed. Positioning holes 26b are formed in first printed substrate 26 at a position adjacently above boss insertion hole 26a in the area where first electrode 21 is formed and at a lateral central part of a lower side of an area where frame-shaped second electrode 22 is formed, respectively. First terminal insertion hole 26c is formed in first printed substrate 26 at an upper-left corner of the area where first electrode 21 is formed.

Snap-fit engagement holes 26d are formed in first printed substrate 26 at lateral central parts of upper and lower sides and vertical central parts of left and right sides of a frame-shaped portion between first electrode 21 and second electrode 22, respectively. Boss insertion holes 26e are formed in first printed substrate 26 at both vertical ends of the left and right sides of the frame-shaped portion between first electrode 21 and second electrode 22, respectively. Screw insertion holes 26f are formed in first printed substrate 26 at four corners of the area where second electrode 22 is formed, respectively.

Second terminal insertion hole 26g is formed in first printed substrate 26 at the vertical central part of the left side of the area where second electrode 22 is formed. Two third terminal insertion holes 26h are formed in first printed substrate 26 to be vertically separated from each other at a vertical central part of a left side of an area where frame-shaped third electrode 23 is formed.

Second printed substrate 27 is disposed to be parallel to first printed substrate 26 while being separated from first printed substrate 26. Fourth electrode 24 is formed at a central part of a surface of second printed substrate 27. Third electrode 23 is formed on an outer perimeter edge of the surface of second printed substrate 27. According to the arrangement of third electrode 23 as described above, third electrode 23 on first printed substrate 26 and third electrode 23 on second printed substrate 27 are disposed to be overlapped with each other as viewed from the substrate arraying direction.

Boss insertion hole 27a is formed in second printed substrate 27 at a central part of an area where fourth electrode 24 is formed, so as to correspond to boss insertion hole 26a in first printed substrate 26. Positioning holes 27b are formed in second printed substrate 27 at a position adjacently above boss insertion hole 27a in the area where fourth electrode 24 is formed and at a lateral central part of a lower side of a frame-shaped portion between third electrode 23 and fourth electrode 24, respectively, so as to correspond to positioning holes 26b in first printed substrate 26. First holding section insertion hole 27c is formed in second printed substrate 27 at a position near an upper-left corner of the area where fourth electrode 24 is formed, so as to correspond to first terminal insertion hole 26c in first printed substrate 26.

Fourth terminal insertion hole 27d is formed in second printed substrate 27 at a position adjacently above first holding section insertion hole 27c in the area where fourth electrode 24 is formed. Engagement section insertion holes 27e are formed in second printed substrate 27 at lateral central parts of both upper and lower ends and at vertical central parts of both left and right ends of the area where fourth electrode 24 is formed, respectively, so as to correspond to engagement holes 26d in first printed substrate 26. Snap-fit engagement holes 27f are formed in second printed substrate 27 at a lateral central part of an upper side and vertical central parts of left and right sides of a frame-shaped portion between third electrode 23 and fourth electrode 24 and at a position adjacently below lowermost engagement section insertion hole 27e in the area where fourth electrode 24 is formed, respectively.

Boss insertion holes 27g are formed in second printed substrate 27 at positions near four corners of the area where fourth electrode 24 is formed, respectively, so as to correspond to boss insertion holes 26e in first printed substrate 26. Boss insertion holes 27h are formed in second printed substrate 27 at four corners of the area where fourth electrode 24 is formed, respectively, so as to correspond to screw insertion holes 26f in first printed substrate 26. Second holding section insertion hole 27i is formed in second printed substrate 27 at the vertical central part of the left side of the frame-shaped portion between third electrode 23 and fourth electrode 24, so as to correspond to second terminal insertion hole 26g in first printed substrate 26.

Two third holding section insertion holes 27j are formed to be vertically separated from each other in second printed substrate 27 at a vertical central part of a left side of an area where frame-shaped third electrode 23 is formed, so as to correspond to third terminal insertion holes 26h in first printed substrate 26. Third terminal insertion holes 27k are formed in second printed substrate 27 at a position adjacently below upper third holding section insertion hole 27j and at a position adjacently above lower third holding section insertion hole 27j on the left side of the area where third electrode 23 is formed, respectively. Protruding plate sections 27l are respectively formed at both lateral ends of both upper and lower ends of second printed substrate 27 so as to protrude outward in the vertical direction. Protruding plate sections 27l are provided with screw insertion holes 27m.

Ground substrate 28 is disposed to be parallel to second printed substrate 27 while being separated from second printed substrate 27. Fifth electrode 25 is formed on the entire surface of ground substrate 28. Controller 40 is formed on the back surface (surface facing metal body 12 in FIG. 9, a surface not shown in FIG. 10) of ground substrate 28. Note that controller 40 may be formed on the back surface of first printed substrate 26 or second printed substrate 27.

Screw insertion hole 28a is formed at a central part of ground substrate 28 so as to correspond to boss insertion hole 26a in first printed substrate 26. Positioning holes 28b are formed in ground substrate 28 at a position adjacently above screw insertion hole 28a and at a lateral central part of a lower end of ground substrate 28, respectively, so as to correspond to positioning holes 26b in first printed substrate 26. Snap-fit engagement holes 28c are formed in ground substrate 28 at a position adjacently below lower positioning hole 28b and at vertical central parts of both left and right ends, respectively.

First terminal insertion hole 28d is formed in ground substrate 28 at a position near an upper-left corner so as to correspond to first terminal insertion hole 26c in first printed substrate 26. First terminal insertion hole 28d is a through-hole plated with copper. Fourth terminal insertion hole 28e is formed in ground substrate 28 at a position adjacently above first terminal insertion hole 28d so as to correspond to fourth terminal insertion hole 27d in second printed substrate 27. Fourth terminal insertion hole 28e is a through-hole plated with copper. Screw insertion holes 28f are formed in ground substrate 28 at positions near four corners, respectively, so as to correspond to boss insertion holes 26e in first printed substrate 26.

Boss insertion holes 28g are formed near four corners of ground substrate 28, respectively, so as to correspond to screw insertion holes 26f in first printed substrate 26. Second terminal insertion hole 28h is formed in ground substrate 28 at the vertical central part of the left end of ground substrate 28 so as to correspond to second terminal insertion hole 26g in first printed substrate 26. Second terminal insertion hole 28h is a through-hole plated with copper. Two first third terminal insertion holes 28i are formed in ground substrate 28 to be vertically separated from each other at the vertical central part of the left end so as to correspond to third terminal insertion holes 26h in first printed substrate 26. First third terminal insertion holes 28i are through-holes plated with copper.

Second third terminal insertion holes 28j are formed in ground substrate 28 at a position adjacently below upper first third terminal insertion hole 28i and at a position adjacently above lower first third terminal insertion hole 28i at the left end, respectively, so as to correspond to third terminal insertion holes 27k in second printed substrate 27. Second third terminal insertion holes 28j are through-holes plated with copper. Protruding plate sections 28k are respectively formed at lateral central parts of both upper and lower ends of ground substrate 28 so as to protrude outward in the vertical direction. U-shaped recesses 28n and positioning holes 28o in protruding plate sections 28k are used for positioning ground substrate 28 with respect to front case 20, for example. Protruding plate sections 28l are respectively formed on both lateral ends of both upper and lower ends of ground substrate 28 so as to protrude outward in the vertical direction. Protruding plate sections 28l are provided with screw insertion holes 28m.

Holder 29 fixedly supports first printed substrate 26, second printed substrate 27, and ground substrate 28. Holder 29 is disposed to be parallel to second printed substrate 27 and ground substrate 28 while being sandwiched between second printed substrate 27 and ground substrate 28. Holder 29 is formed from resin. Holder 29 has a plate-shaped holder body 29a. Holder body 29a is formed to have a shape in which four corners of a vertically long rectangle are cut in a triangular shape. Holder body 29a is formed into a substantial two-by-two matrix shape in which an opening is formed in each of upper, lower, left, and right regions formed by dividing holder body 29a into four.

Boss 29b is formed on a central part of a surface of holder body 29a so as to correspond to boss insertion hole 26a in first printed substrate 26. Boss 29b is formed to extend from holder body 29a toward first printed substrate 26 in the substrate arraying direction. Four plate-shaped receiving sections 29c are formed on the portion of the circumferential surface of boss 29b close to ground substrate 28 with respect to the substrate arraying direction so as to be equally spaced in the circumferential direction. Receiving sections 29c are formed to extend in the substrate arraying direction. Boss 29b receives first printed substrate 26 and second printed substrate 27 by receiving sections 29c while being inserted through boss insertion holes 26a and 27a in first printed substrate 26 and second printed substrate 27. Screw 32 inserted through screw insertion hole 28a in ground substrate 28 is screwed to boss 29b. Thus, ground substrate 28 is fixedly supported by holder 29 by screwing.

Positioning bosses 29d (positioning sections) are formed on holder body 29a at a position adjacently above boss 29b and at a lateral central part of a lower end of holder body 29a, respectively, so as to correspond to positioning holes 26b in first printed substrate 26. Positioning bosses 29d are formed to extend from front and back surfaces of holder body 29a toward first printed substrate 26 and toward ground substrate 28, respectively, in the substrate arraying direction. Positioning bosses 29d extending from the front surface of holder body 29a are inserted into positioning holes 26b and 27b in first printed substrate 26 and second printed substrate 27, and positioning bosses 29d extending from the back surface are inserted through positioning holes 28b in ground substrate 28. Thus, printed substrates 26 and 27 and ground substrate 28 are positioned with respect to holder 29.

Snap-fit engagement sections 29e are respectively formed at lateral central parts of both upper and lower ends and at vertical central parts of both left and right ends of holder body 29a so as to correspond to engagement holes 26d in first printed substrate 26. Engagement sections 29e are formed to protrude from holder body 29a toward first printed substrate 26 in the substrate arraying direction. Engagement sections 29e are engaged with engagement holes 26d in first printed substrate 26 while being inserted through engagement section insertion holes 27e in second printed substrate 27. Thus, first printed substrate 26 is fixedly supported by holder 29 with snap fit.

Snap-fit engagement sections 29f are respectively formed at the lateral central parts of both upper and lower ends and at the vertical central parts of both left and right ends of holder body 29a so as to correspond to engagement holes 27f in second printed substrate 27. Engagement sections 29f are formed to protrude from holder body 29a toward first printed substrate 26 in the substrate arraying direction. Engagement sections 29f are engaged with engagement holes 27f in second printed substrate 27. Thus, second printed substrate 27 is fixedly supported by holder 29 with snap fit.

Snap-fit engagement sections 29g are formed on holder body 29a at a position adjacently below lower positioning boss 29d and at the vertical central parts of both left and right ends, respectively, so as to correspond to engagement holes 28c in ground substrate 28. Engagement sections 29g are formed to protrude from holder body 29a toward ground substrate 28 in the substrate arraying direction. Engagement sections 29g are engaged with engagement holes 28c in ground substrate 28. Thus, ground substrate 28 is fixedly supported by holder 29 with snap fit.

On holder body 29a thus configured, engagement section 29e and engagement section 29f are arrayed in this order from bottom to top at the lateral central part of the upper end, engagement section 29e, engagement section 29f, positioning boss 29d, and engagement section 29g are arrayed in this order from top to bottom at the lateral central part of the lower end, and engagement sections 29e, engagement sections 29f, and engagement sections 29g are arrayed in this order from inside to outside in the lateral direction at the vertical central parts of both left and right ends.

Screw insertion holes 29h are formed in holder body 29a at positions near four corners, respectively, so as to correspond to boss insertion holes 26e in first printed substrate 26. Screws (not illustrated) inserted through screw insertion holes 28f and 29h in ground substrate 28 and holder 29 are screwed to bosses 20a on front case 20 inserted through boss insertion holes 26e and boss insertion holes 27g in first printed substrate 26 and second printed substrate 27. Thus, front case 20 is fixedly supported by holder 29 by screwing.

Bosses 29i are respectively formed at four corners of holder body 29a so as to correspond to screw insertion holes 26f in first printed substrate 26. Bosses 29i are formed to extend from front and back surfaces of holder body 29a toward first printed substrate 26 and toward ground substrate 28, respectively, in the substrate arraying direction. Screws 32 inserted through screw insertion holes 26f in first printed substrate 26 are screwed to bosses 29i inserted through boss insertion holes 27h and 28g in second printed substrate 27 and ground substrate 28. Thus, first printed substrate 26 is fixedly supported by holder 29 by screwing.

Bosses 29j are respectively formed at both lateral ends of both upper and lower ends of holder body 29a so as to correspond to protruding plate sections 27l on second printed substrate 27. Bosses 29j are formed to extend from holder body 29a toward ground substrate 28 in the substrate arraying direction. Screws 32 inserted through screw insertion holes 27m in protruding plate sections 27l are screwed to bosses 29j. Thus, second printed substrate 27 is fixedly supported by holder 29 by screwing.

Bosses 29k are respectively formed adjacent to the right side of left boss 29j and adjacent to the left side of right boss 29j at both ends of upper and lower ends of holder body 29a, so as to correspond to protruding plate sections 28l on ground substrate 28. Bosses 29k are formed to extend from holder body 29a toward first printed substrate 26 in the substrate arraying direction. Screws 32 inserted through screw insertion holes 28m in protruding plate sections 28l are screwed to bosses 29k. Thus, ground substrate 28 is fixedly supported by holder 29 by screwing.

First holding section 29l is formed near the upper-left corner of the surface of holder body 29a so as to correspond to first terminal insertion hole 26c in first printed substrate 26. First holding section 29l is formed into a columnar shape extending from holder body 29a toward first printed substrate 26 in the substrate arraying direction. First holding section 29l extends near the back surface of first printed substrate 26 while being inserted through first holding section insertion hole 27c in second printed substrate 27.

First terminal (lead line) 33 is fixedly provided to first holding section 29l so as to extend in the substrate arraying direction. First terminal 33 is formed from copper which is a material having a linear expansion coefficient same as that of first electrode 21. First terminal 33 is formed integrally with first holding section 29l by insert molding. First terminal 33 includes an insertion part (not illustrated), first shoulder part 33a, first connection part 33b, second shoulder part 33c, and second connection part 33d. The insertion part is formed into a line shape extending in the substrate arraying direction. The insertion part is inserted into first holding section 29l. First shoulder part 33a is formed into a thin plate shape extending from an end of the insertion part close to first printed substrate 26 with respect to the substrate arraying direction so as to be parallel to first printed substrate 26. First shoulder part 33a is disposed to be in contact with the back surface of first printed substrate 26 and an end face of first holding section 29l close to first printed substrate 26 with respect to the substrate arraying direction. First connection part 33b is formed into a line shape extending toward first printed substrate 26 from first shoulder part 33a in the substrate arraying direction. First connection part 33b is connected to first electrode 21 by soldering while being inserted through first terminal insertion hole 26c in first printed substrate 26.

Second shoulder part 33c is formed into a thin plate shape extending from an end of the insertion part of first terminal 33 close to ground substrate 28 with respect to the substrate arraying direction so as to be parallel to first printed substrate 26. Second shoulder part 33c is disposed to be in contact with the back surface of holder body 29a and the surface of ground substrate 28. Second connection part 33d is formed into a line shape extending toward ground substrate 28 from second shoulder part 33c in the substrate arraying direction. Second connection part 33d is connected to first terminal insertion hole 28d in ground substrate 28 by soldering while being inserted through first terminal insertion hole 28d. Thus, first printed substrate 26 and second printed substrate 27 are kept separated from each other.

First terminal insertion hole 28*d* is electrically connected to controller 40 by a copper foil pattern on the back surface of ground substrate 28. First terminal 33 configured as described above electrically connects first electrode 21 and controller 40.

Fourth terminal 34 is formed on holder body 29*a* at a position adjacently above first holding section 29*l* so as to correspond to fourth terminal insertion hole 27*d* in second printed substrate 27. Fourth terminal 34 is formed from copper. Fourth terminal 34 is formed integrally with holder body 29*a* by insert molding. Fourth terminal 34 includes an insertion part (not illustrated), first shoulder part 34*a*, first connection part 34*b*, second shoulder part 34*c*, and second connection part 34*d*. The insertion part is formed into a line shape extending in the substrate arraying direction. The insertion part is inserted through holder body 29*a*. First shoulder part 34*a* is formed into a thin plate shape extending from an end of the insertion part close to first printed substrate 26 with respect to the substrate arraying direction so as to be parallel to first printed substrate 26. First shoulder part 34*a* is disposed to be in contact with the surface of holder body 29*a* and the back surface of second printed substrate 27. First connection part 34*b* is formed into a line shape extending toward first printed substrate 26 from first shoulder part 34*a* in the substrate arraying direction. First connection part 34*b* is connected to fourth electrode 24 by soldering while being inserted through fourth terminal insertion hole 27*d* in second printed substrate 27.

Second shoulder part 34*c* is formed into a thin plate shape extending from an end of the insertion part of fourth terminal 34 close to ground substrate 28 with respect to the substrate arraying direction so as to be parallel to first printed substrate 26. Second shoulder part 34*c* is disposed to be in contact with the back surface of holder body 29*a* and the surface of ground substrate 28. Second connection part 34*d* is formed into a line shape extending toward ground substrate 28 from the surface of second shoulder part 34*c* in the substrate arraying direction. Second connection part 34*d* is connected to fourth terminal insertion hole 28*e* in ground substrate 28 by soldering while being inserted through fourth terminal insertion hole 28*e*. Thus, fourth terminal 34 has a function similar to first terminal 33.

Fourth terminal insertion hole 28*e* is electrically connected to controller 40 by the copper foil pattern on the back surface of ground substrate 28. Fourth terminal 34 configured as described above electrically connects fourth electrode 24 and controller 40.

Second holding section 29*m* is formed at the vertical central part of the left end of holder body 29*a* so as to correspond to second terminal insertion hole 26*g* in first printed substrate 26. Second holding section 29*m* has a configuration similar to the configuration of first holding section 29*l*. Second holding section 29*m* extends near the back surface of first printed substrate 26 while being inserted through second holding section insertion hole 27*i* in second printed substrate 27.

Second terminal 35 is fixedly supported by second holding section 29*m*. Second terminal 35 has a configuration similar to the configuration of first terminal 33. Second terminal 35 is connected to second electrode 22 by soldering while being inserted through second terminal insertion hole 26*g* in first printed substrate 26. Second terminal 35 is also connected to second terminal insertion hole 28*h* in ground substrate 28 by soldering while being inserted through second terminal insertion hole 28*h*. Thus, second terminal 35 has a function similar to first terminal 33.

Second terminal insertion hole 28*h* is electrically connected to controller 40 by the copper foil pattern on the back surface of ground substrate 28. Second terminal 35 configured as described above electrically connects second electrode 22 and controller 40.

Two third holding sections 29*n* are formed to be vertically separated from each other at the vertical central part of the left end of holder body 29*a* so as to correspond to third terminal insertion holes 26*h* in first printed substrate 26. Third holding sections 29*n* have a configuration similar to the configuration of first holding section 29*l*. Third holding sections 29*n* extend near the back surface of first printed substrate 26 while being inserted through third holding section insertion holes 27*j* in second printed substrate 27.

First third terminals 36 are fixedly supported by third holding sections 29*n*. First third terminals 36 have a configuration similar to the configuration of first terminal 33. First third terminals 36 are connected to third electrode 23 by soldering while being inserted through third terminal insertion holes 26*h* in first printed substrate 26. First third terminals 36 are also connected to first third terminal insertion holes 28*i* in ground substrate 28 by soldering while being inserted through first third terminal insertion holes 28*i*. Thus, first third terminals 36 have a function similar to first terminal 33.

First third terminal insertion holes 28*i* are electrically connected to controller 40 by the copper foil pattern on the back surface of ground substrate 28. First third terminals 36 configured as described above electrically connect third electrode 23 on first printed substrate 26 and controller 40.

Second third terminals 37 are formed on holder body 29*a* at a position adjacently below upper third holding section 29*n* and at a position adjacently above lower third holding section 29*n* on the left end of holder body 29*a*, respectively, so as to correspond to third terminal insertion holes 27*k* in second printed substrate 27. Second third terminals 37 have a configuration similar to the configuration of fourth terminal 34. Second third terminals 37 are connected to third electrode 23 on second printed substrate 27 by soldering while being inserted through third terminal insertion holes 27*k* in second printed substrate 27. Second third terminals 37 are also connected to second third terminal insertion holes 28*j* in ground substrate 28 by soldering while being inserted through second third terminal insertion holes 28*j*. Thus, second third terminals 37 have a function similar to fourth terminal 34.

Second third terminal insertion holes 28*j* are electrically connected to controller 40 by the copper foil pattern on the back surface of ground substrate 28. Second third terminals 37 configured as described above electrically connect third electrode 23 on second printed substrate 27 and controller 40.

The description for FIGS. 3, 4, 5, and 6 is the same as the description in the first exemplary embodiment, so that it will not be repeated below.

Effect

As described above, according to the present exemplary embodiment, holder 29 fixedly supports first printed substrate 26, second printed substrate 27, and ground substrate 28, whereby, even when vibration or thermal shock is applied to electrostatic detection sensor 10, distances among electrodes 21 to 25 formed on substrates 26 to 28 can be kept constant (the positional relation among electrodes 21 to 25 can be maintained). Therefore, a change in capacitance caused by vibration or thermal shock applied to electrostatic detection sensor 10 can be reduced, whereby the detection precision of electrostatic detection sensor 10 can be improved.

In addition, first printed substrate 26 and second printed substrate 27 are disposed to be parallel to each other while being separated from each other in the substrate arraying direction, and third electrode 23 is formed on the surfaces of first printed substrate 26 and second printed substrate 27 so as to be overlapped with each other as viewed from the substrate arraying direction, whereby a change in capacitance, caused by water, at a portion near third electrode 23, that is, at a portion corresponding to the vicinity of the peripheral part of electrostatic detection sensor 10 on the surface of resin bumper 11, can be detected by a simple structure of a double-layer structure of first printed substrate 26 and second printed substrate 27.

In addition, terminals 33 to 37 are fixedly held by holder 29, whereby terminals 33 to 37 can be fixedly held by using holder 29 without additionally providing a member for fixedly holding terminals 33 to 37.

In addition, terminals 33 to 37 are formed from a material (copper) having a linear expansion coefficient same as that of the material of first electrode 21 to fourth electrode 24, whereby, even if first electrode 21 to fourth electrode 24 and terminals 33 to 37 expand and contract due to a temperature change, the degree of the expansion/contraction is the same between first electrode 21 to fourth electrode 24 and terminals 33 to 37. Therefore, even if a temperature change occurs, distances among first electrode 21 to fifth electrode 25 can be kept constant. Accordingly, the detection precision of electrostatic detection sensor 10 can further be improved.

In addition, terminals 33 to 37 are disposed while being sandwiched between holder 29 and substrates 26 to 28, by which shoulder parts 33a, 33c, 34a, and 34c of terminals 33 to 37 are in contact with substrates 26 to 28. Therefore, terminals 33 to 37 are hardly affected by the expansion and contraction of holder 29 caused by a temperature change. Accordingly, even if a temperature change occurs, distances among electrodes 21 to 25 can be more reliably kept constant. Thus, the detection precision of electrostatic detection sensor 10 can further be improved.

In addition, positioning boss 29d is provided to holder 29 to extend in the thickness direction of substrates 26 to 28, whereby substrates 26 to 28 as well as first electrode 21 to fifth electrode 25 can be positioned with high precision.

Further, first printed substrate 26, second printed substrate 27, and ground substrate 28 are fixedly supported by holder 29 by screwing, whereby, even if vibration or thermal shock is applied to electrostatic detection sensor 10, a load applied to the soldered parts of terminals 33 to 37 can be reduced. Therefore, resistance to thermal shock and vibration resistance of electrostatic detection sensor 10 can be improved.

In addition, first printed substrate 26, second printed substrate 27, and ground substrate 28 are fixedly supported by holder 29, whereby substrates 26 to 28 and holder 29 can be formed into a unit. Therefore, electrostatic detection sensor 10 can easily be assembled by screwing this unit to front case 20. Accordingly, electrostatic detection sensor 10 can be manufactured at a low cost.

In the present exemplary embodiment, third electrode 23 is formed on the surfaces of first printed substrate 26 and second printed substrate 27. However, third electrode 23 may be formed on peripheral surfaces (side surfaces) of first printed substrate 26 and second printed substrate 27, in addition to the surfaces of first printed substrate 26 and second printed substrate 27. According to this configuration, a change in capacitance caused by water at a portion near third electrode 23, that is, at a portion corresponding to the vicinity of the peripheral of electrostatic detection sensor 10 on the surface of resin bumper 11, can more reliably be detected.

In the present exemplary embodiment, terminals 33 to 37 are formed from a material having a linear coefficient expansion same as that of the material of first electrode 21 to fourth electrode 24. However, they may be formed from a material having a linear expansion coefficient substantially same (approximately same) as that of the material of first electrode 21 to fourth electrode 24. In this case as well, the degree of the expansion/contraction due to a temperature change becomes substantially the same between first electrode 21 to fourth electrode 24 and terminals 33 to 37.

In the present exemplary embodiment, terminals 33 to 37 are fixed and held by holder 29 by insert molding. However, the configuration is not limited thereto, and terminals 33 to 37 may be fixed and held by press fitting, for example.

In the present exemplary embodiment, the number of each of third terminals 36 and 37 are two. However, it is not limited thereto, and may be one, for example.

In the present exemplary embodiment, electrostatic detection sensor 10 has a portion where substrates 26 to 28 are fixed to holder 29 by snap fit. However, a boss is provided to this portion on holder 29, and substrates 26 to 28 may be fixed to holder 29 by screwing a screw to the boss.

In the present exemplary embodiment, terminal insertion holes 28d, 28e, and 28h to 28j are a through-hole plated with copper. However, they are not limited thereto, and may be a through-hole into which a copper paste or a silver paste is buried, for example.

Third Exemplary Embodiment

The present exemplary embodiment is different from the second exemplary embodiment in the configuration of electrostatic detection sensor 10, and is the same as the second exemplary embodiment in other points. In the description below, the redundant description of the components same as the components in the second exemplary embodiment may be omitted.

Figure 12:
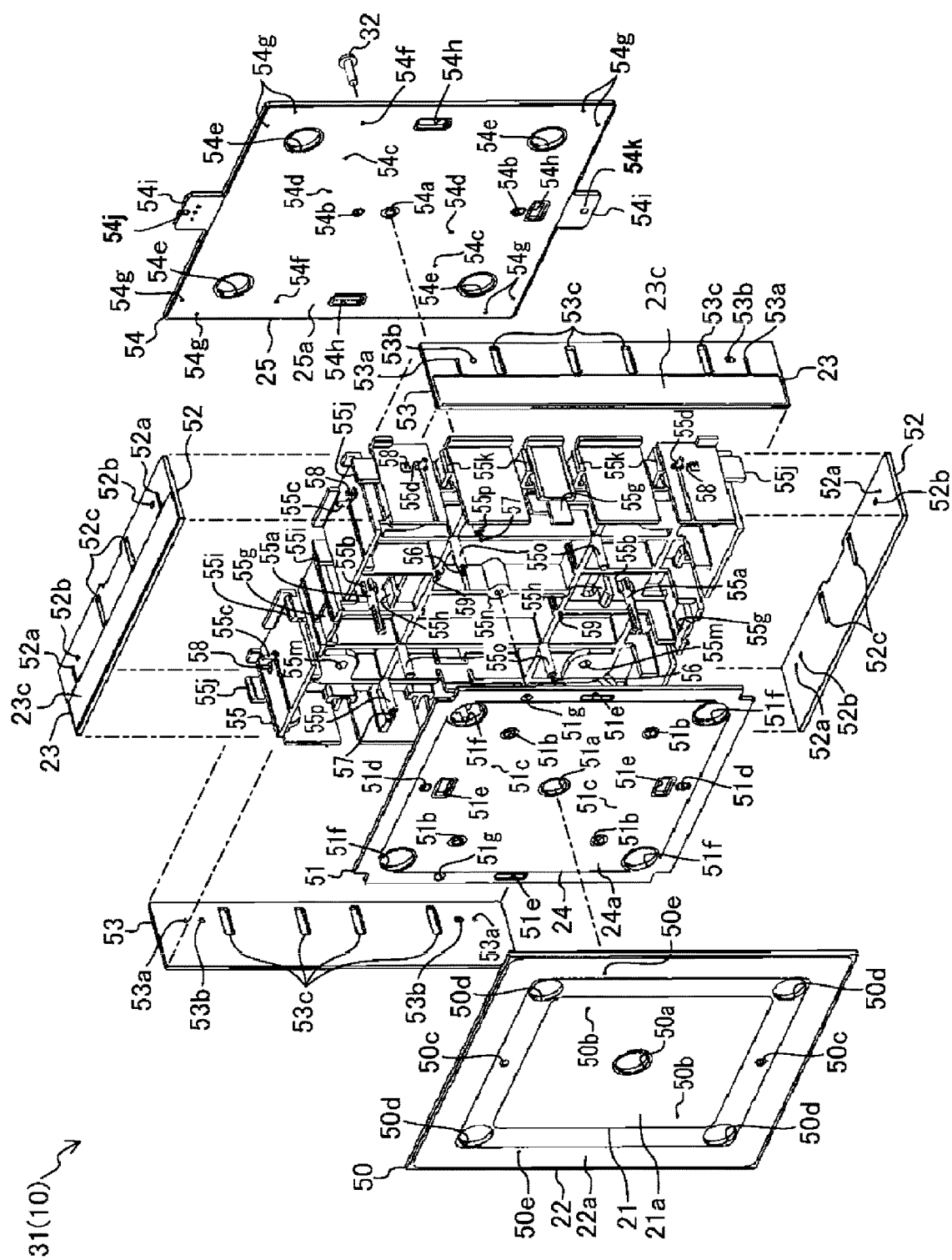
FIG. 12 is an exploded perspective view illustrating an electrostatic detection sensor according to a third exemplary embodiment.
Figure 13:
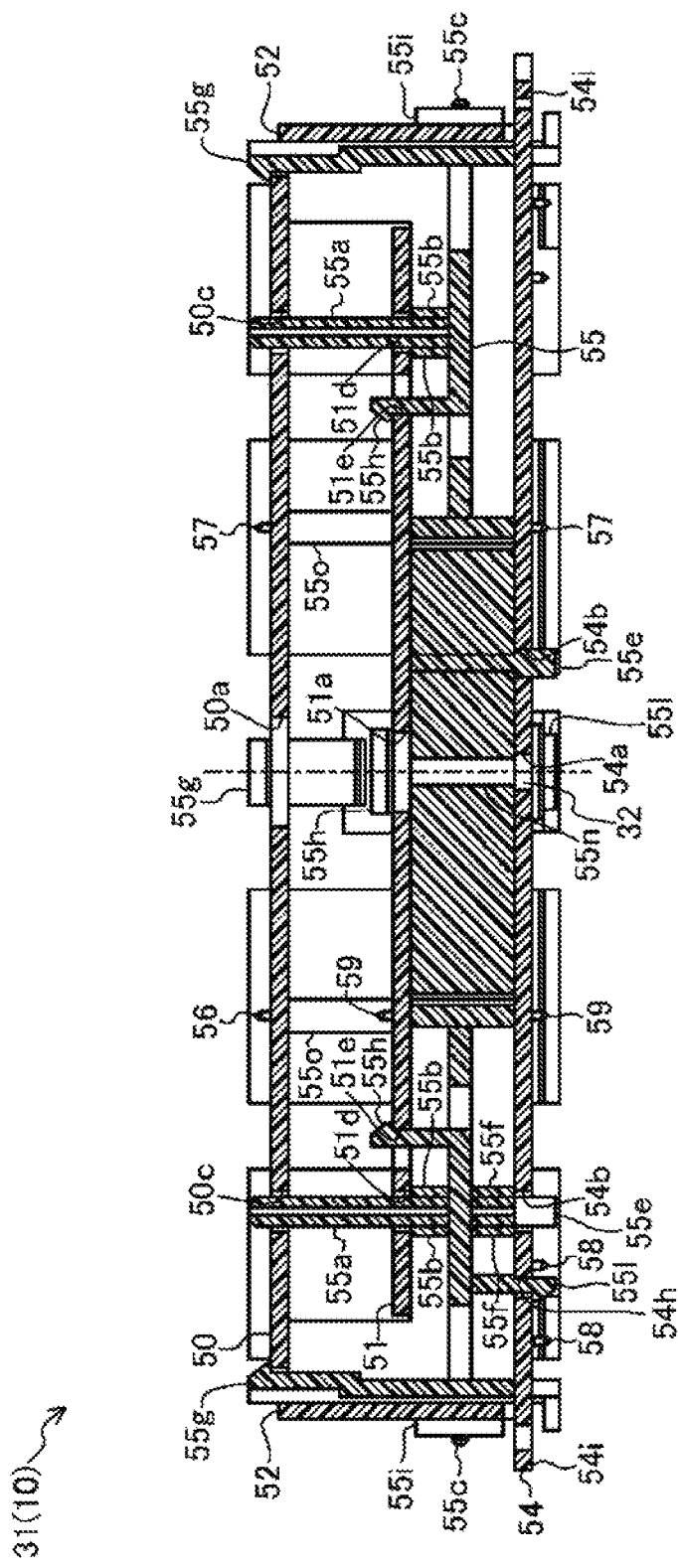
FIG. 13 is a sectional view of the electrostatic detection sensor according to the third exemplary embodiment.

FIG. 12 is an exploded perspective view illustrating electrostatic detection sensor 10 according to the third exemplary embodiment. FIG. 13 is a sectional view of electrostatic detection sensor 10. Electrostatic detection sensor 10 includes a front case (not illustrated), first electrode 21 to fifth electrode 25, first printed substrate 50 (first substrate), second printed substrate 51 (fourth electrode substrate), third printed substrate 52 (second substrate), fourth printed substrate 53 (second substrate), ground substrate 54 (fifth electrode substrate), holder 55 (fixing member), a back cover (not illustrated), controller 40 (see FIG. 3), and the like. First electrode 21 to fifth electrode 25, first printed substrate 50 to fourth printed substrate 53, ground substrate 54, holder 55, and controller 40 constitute sensor body 31.

In the following description, for the sake of convenience of easy understanding of the description, "top", "bottom", "left", and "right" in FIG. 12 respectively correspond to the "top", "bottom", "left", and "right" of electrostatic detection sensor 10. FIG. 13 illustrates electrostatic detection sensor 10 which is cut at right angles to the lateral direction thereof.

Third electrode 23 is disposed to surround the entire periphery of second electrode 22 while being separated from second electrode 22 at substantially equal spaces as viewed from the thickness direction of first printed substrate 50, that is, an arraying direction of first printed substrate 50, second printed substrate 51, and ground substrate 54 (this arraying direction is referred to as "substrate arraying direction" below).

First electrode 21, fourth electrode 24, and fifth electrode 25 are formed into substantially a square shape. Second electrode 22 is formed into substantially a square frame shape. Third electrode 23 on third printed substrate 52 is formed into a rectangle which is horizontally long. Third electrode 23 on fourth printed substrate 53 is formed into a rectangle which is vertically long. Fourth electrode 24 is formed to be larger than first electrode 21 as viewed from the substrate arraying direction.

Second flat surface 22a of second electrode 22, fourth flat surface 24a of fourth electrode 24, and fifth flat surface 25a of fifth electrode 25 are parallel to first flat surface 21a of first electrode 21. Outer surface 23c of third electrode 23 is perpendicular to second flat surface 22a.

The front case, first printed substrate 50, second printed substrate 51, ground substrate 54, and the back cover are arrayed in this order in the substrate arraying direction so as to be overlapped with one another. First printed substrate 50 and ground substrate 54 are formed into substantially a square shape. Second printed substrate 51 is formed into a shape in which four corners of a square are cut in a square. Third printed substrate 52 is formed into a rectangle which is horizontally long. Fourth printed substrate 53 is formed into a rectangle which is vertically long. Holder 55 is formed into substantially a rectangular parallelepiped shape by assembling plate members in the vertical direction, horizontal direction, and substrate arraying direction.

Second printed substrate 51 is formed to be smaller than first printed substrate 50 and ground substrate 54 as viewed from the substrate arraying direction. The surface of third printed substrate 52 and the surface of fourth printed substrate 53 are perpendicular to the surface of first printed substrate 50.

First printed substrate 50 is disposed on a surface (surface facing inner surface 11A of resin bumper 11 in FIG. 1, surface which is shown in FIG. 12) of holder 55. First electrode 21 is formed on a central part of a surface of first printed substrate 50. Second electrode 22 is formed on an outer perimeter edge of the surface of first printed substrate 50.

Boss insertion hole 50a is formed in first printed substrate 50 at a central part of an area where first electrode 21 is formed. First terminal insertion holes 50b are formed in first printed substrate 50 at an upper-right corner and a lower-left corner of the area where first electrode 21 is formed, respectively. Positioning holes 50c are formed in first printed substrate 50 at lateral central parts of upper and lower sides of a frame-shaped portion between first electrode 21 and second electrode 22, respectively.

Boss insertion holes 50d are formed in first printed substrate 50 at four corners of the frame-shaped portion between first electrode 21 and second electrode 22, respectively. Second terminal insertion holes 50e are formed in first printed substrate 50 at positions, close to an upper end, of left and right sides of the area where second electrode 22 is formed, respectively.

Second printed substrate 51 is disposed in holder 55 to be parallel to first printed substrate 50 while being separated from first printed substrate 50. Fourth electrode 24 is formed at a central part of a surface of second printed substrate 51.

Boss insertion hole 51a is formed in second printed substrate 51 at a central part of an area where fourth electrode 24 is formed, so as to correspond to boss insertion hole 50a in first printed substrate 50. A boss (not illustrated) of the front case is inserted through boss insertion holes 50a and 51a. First holding section insertion holes 51b are formed in second printed substrate 51 at positions close to four corners of the area where fourth electrode 24 is formed, respectively. Among first holding section insertion holes 51b, upper-right one and lower-left one are formed to correspond to first terminal insertion holes 50b in first printed substrate 50, respectively.

Fourth terminal insertion holes 51c are formed in second printed substrate 51 at positions adjacently on the left side of upper-right first holding section insertion hole 51b and adjacently on the right side of lower-left first holding section insertion hole 51b in the area where fourth electrode 24 is formed, respectively. Positioning holes 51d are formed in second printed substrate 51 at lateral central parts of both upper and lower ends of the area where fourth electrode 24 is formed, respectively, so as to correspond to positioning holes 50c in first printed substrate 50. Snap-fit engagement holes 51e are formed in second printed substrate 51 at positions adjacently below upper positioning hole 51d and adjacently above lower positioning hole 51d in the area where fourth electrode 24 is formed, and vertical central parts of both left and right sides on an outer perimeter edge of a frame-shaped part of second printed substrate 51 other than the area where fourth electrode 24 is formed, respectively.

Boss insertion holes 51f are formed in second printed substrate 51 at four corners of the area where fourth electrode 24 is formed, respectively, so as to correspond to boss insertion holes 50d in first printed substrate 50. Second holding section insertion holes 51g are formed in second printed substrate 51 at positions, close to the upper end, of left and right sides on the outer perimeter edge, respectively, so as to correspond to second terminal insertion holes 50e in first printed substrate 50.

Third printed substrate 52 and fourth printed substrate 53 are disposed on a peripheral surface of holder 55. That is, third printed substrate 52 and fourth printed substrate 53 are disposed to surround first printed substrate 50 while being separated from first printed substrate 50 as viewed from the substrate arraying direction. Specifically, third printed substrate 52 is disposed on upper and lower side surfaces of holder 55, and fourth printed substrate 53 is disposed on left and right side surfaces of holder 55. Third electrode 23 is formed on the surfaces of third printed substrate 52 and fourth printed substrate 53, respectively, in areas close to first printed substrate 50 in the substrate arraying direction. Third electrode 23 is formed such that a part of a rectangular main body linearly extends to third terminal insertion holes 52a and 53a (which will be described later) in third printed substrate 52 and fourth printed substrate 53.

Third terminal insertion holes 52a are formed in third printed substrate 52 at both lateral ends in an area close to ground substrate 54 in the substrate arraying direction (area other than the area where third electrode 23 is formed), respectively. Positioning holes 52b are formed in third printed substrate 52 at positions adjacently on the right side of left third terminal insertion hole 52a and adjacently on the left side of right third terminal insertion hole 52a in the area close to ground substrate 54, respectively. Two snap-fit engagement holes 52c are formed in third printed substrate 52 between left and right positioning holes 52b in the area close to ground substrate 54 so as to be laterally separated from each other.

Third terminal insertion holes 53a are formed in fourth printed substrate 53 at both vertical ends in an area close to ground substrate 54 in the substrate arraying direction (area other than the area where third electrode 23 is formed), respectively. Positioning holes 53b are formed in fourth printed substrate 53 at positions adjacently below upper third terminal insertion hole 53a and adjacently above lower third terminal insertion hole 53a in the area close to ground substrate 54, respectively. Four snap-fit engagement holes 53c are formed in fourth printed substrate 53 between upper and lower positioning holes 53b in the area close to ground substrate 54 so as to be vertically separated from one another.

Ground substrate 54 is disposed on the back surface (the surface facing metal body 12 in FIG. 1, the surface not shown in FIG. 12) of holder 55 so as to be parallel to second printed substrate 51 while being separated from second printed substrate 51. Fifth electrode 25 is formed on an entire surface of ground substrate 54. Controller 40 is formed at the upper part of the back surface of ground substrate 54.

Screw insertion hole 54a is formed in ground substrate 54 at a central part so as to correspond to boss insertion hole 50a in first printed substrate 50. Positioning holes 54b are formed in ground substrate 54 at positions adjacently above screw insertion hole 54a and at a lateral central part of a lower end, respectively. Lower positioning hole 54b out of positioning holes 54b is formed to correspond to lower positioning hole 50c in first printed substrate 50.

First terminal insertion holes 54c are formed in ground substrate 54 at positions near an upper-right corner and a lower-left corner, respectively, so as to correspond to first terminal insertion holes 50b in first printed substrate 50. First terminal insertion holes 54c are a through-hole plated with copper. Fourth terminal insertion holes 54d are formed in ground substrate 54 at positions adjacently on the left side of upper-right first terminal insertion hole 54c and adjacently on the right side of lower-left first terminal insertion hole 54c, respectively, so as to correspond to fourth terminal insertion holes 51c in second printed substrate 51. Fourth terminal insertion holes 54d are a through-hole plated with copper. Screw insertion holes 54e are formed in ground substrate 54 at positions near four corners, respectively, so as to correspond to boss insertion holes 50d in first printed substrate 50.

Second terminal insertion holes 54f are formed in ground substrate 54 at positions near the upper end of both left and right ends, respectively, so as to correspond to second terminal insertion holes 50e in first printed substrate 50. Second terminal insertion holes 54f are a through-hole plated with copper. Two third terminal insertion holes 54g are each formed at four corners of ground substrate 54. One of third terminal insertion holes 54g formed at each corner of ground substrate 54 is formed near one side of two sides constituting the corner, and the other one of third terminal insertion holes 54g are formed near the other side. Third terminal insertion holes 54g are a through-hole plated with copper.

Snap-fit engagement holes 54h are formed in ground substrate 54 at the lateral central part of the lower end and vertical central parts of both left and right ends, respectively. Protruding plate sections 54i are respectively formed at the lateral central parts of both upper and lower ends of ground substrate 54 so as to protrude outward in the vertical direction. U-shaped recesses 54j and positioning holes 54k in protruding plate sections 54i are used for positioning ground substrate 54 with respect to the front case, for example.

Holder 55 fixedly supports first printed substrate 50 to fourth printed substrate 53 and ground substrate 54. Holder 55 is formed from resin.

Positioning bosses 55a (positioning sections) are provided on holder 55 at lateral central parts of both upper and lower ends, respectively, so as to correspond to positioning holes 50c in first printed substrate 50. Positioning bosses 55a are formed to extend from a horizontal plate ("horizontal" means the lateral direction in FIG. 13) inside of holder 55 toward first printed substrate 50 in the substrate arraying direction. Each positioning boss 55a is provided with four plate-shaped receiving sections 55b on its peripheral surface at an end close to ground substrate 54 with respect to the substrate arraying direction, so as to be equally spaced in the circumferential direction. Receiving sections 55b are formed to extend in the substrate arraying direction. Positioning bosses 55a are inserted through positioning holes 50c and 51d in first printed substrate 50 and second printed substrate 51 while receiving second printed substrate 51 by receiving sections 55b. Thus, first printed substrate 50 and second printed substrate 51 are positioned with respect to holder 55.

Positioning bosses 55c are respectively provided at both lateral ends of upper and lower side surfaces of holder 55 so as to correspond to positioning holes 52b in third printed substrate 52. Positioning bosses 55c are formed to extend outward in the vertical direction (thickness direction of third printed substrate 52) from the side surfaces of holder 55. Positioning bosses 55c are inserted through positioning holes 52b in third printed substrate 52. Thus, third printed substrate 52 is positioned with respect to holder 55.

Positioning bosses 55d are respectively provided at both vertical ends of the left and right side surfaces of holder 55 so as to correspond to positioning holes 53b in fourth printed substrate 53. Positioning bosses 55d are formed to extend outward in the lateral direction (thickness direction of fourth printed substrate 53) from the side surfaces of holder 55. Positioning bosses 55d are inserted through positioning holes 53b in fourth printed substrate 53. Thus, fourth printed substrate 53 is positioned with respect to holder 55.

Positioning bosses 55e are respectively provided at the central part of holder 55 and the lateral central part of the lower end of holder 55 so as to correspond to positioning holes 54b in ground substrate 54. Upper positioning boss 55e out of positioning bosses 55e is formed to extend from a vertical plate ("vertical" means the vertical direction in FIG. 13) inside of holder 55 toward ground substrate 54 in the substrate arraying direction, and lower positioning boss 55e is formed to extend from the horizontal plate inside of holder 55 toward ground substrate 54 in the substrate arraying direction. Lower positioning boss 55e is provided with receiving sections 55f on its peripheral surface at an end close to first printed substrate 50 with respect to the substrate arraying direction. Receiving sections 55f have a configuration same as the configuration of receiving sections 55b on positioning boss 55a. Positioning bosses 55e are inserted through positioning holes 54b in ground substrate 54 in a state where receiving sections 55f on lower positioning boss 55e receive ground substrate 54. Thus, ground substrate 54 is positioned with respect to holder 55.

Engagement sections 55g are respectively formed at the lateral central parts of upper and lower side surfaces of holder 55 and vertical central parts of left and right side surfaces of holder 55. Engagement sections 55g are formed to protrude from the vertical plate inside of holder 55 toward first printed substrate 50 in the substrate arraying direction. Engagement sections 55g are engaged with the outer perimeter edge of first printed substrate 50. Thus, first printed substrate 50 is fixedly supported by holder 55 by hooking.

Snap-fit engagement sections 55h are respectively formed at the lateral central parts of both upper and lower ends of holder 55 so as to correspond to engagement holes 51e in second printed substrate 51. Engagement sections 55h are formed to protrude from the horizontal plate inside of holder 55 toward first printed substrate 50 in the substrate arraying direction. Engagement sections 55h are engaged with engagement holes 51e in second printed substrate 51. Thus, second printed substrate 51 is fixedly supported by holder 55 with snap fit.

Two snap-fit engagement sections 55i are each formed to be laterally separated from each other at the lateral central parts of upper and lower side surfaces of holder 55 so as to correspond to engagement holes 52c in third printed substrate 52. Engagement sections 55i are formed to protrude outward in the vertical direction from the side surfaces of holder 55. Engagement sections 55i are engaged with engagement holes 52c in third printed substrate 52. Thus, third printed substrate 52 is fixedly supported by holder 55 with snap fit.

Engagement sections 55j are respectively formed at both lateral ends of the upper and lower side surfaces of holder 55. Engagement sections 55j are formed to protrude outward in the vertical direction from the side surfaces of holder 55. Engagement sections 55j are engaged with both lateral ends of third printed substrate 52. Thus, third printed substrate 52 is fixedly supported by holder 55 by hooking.

Four snap-fit engagement sections 55k are each formed to be vertically separated from one another at the left and right side surfaces of holder 55 so as to correspond to engagement holes 53c in fourth printed substrate 53. Engagement sections 55k are formed to protrude outward in the lateral direction from the side surfaces of holder 55. Engagement sections 55k are engaged with engagement holes 53c in fourth printed substrate 53. Thus, fourth printed substrate 53 is fixedly supported by holder 55 with snap fit.

Snap-fit engagement sections 55l are respectively formed at the lateral central part of the lower end of holder 55 and vertical central parts of both left and right ends of holder 55 so as to correspond to engagement holes 54h in ground substrate 54. Engagement sections 55l are formed to protrude from the horizontal plate inside of holder 55 toward ground substrate 54 in the substrate arraying direction. Engagement sections 55l are engaged with engagement holes 54h in ground substrate 54. Thus, ground substrate 54 is fixedly supported by holder 55 with snap fit.

Screw insertion holes 55m are formed in holder 55 at positions near four corners, respectively, so as to correspond to boss insertion holes 50d in first printed substrate 50. Screw insertion holes 55m are formed in the horizontal plate inside of holder 55. Screws (not illustrated) inserted through screw insertion holes 54e and 55m in ground substrate 54 and holder 55 are screwed to bosses (not illustrated) on the front case inserted through boss insertion holes 50d and 51f in first printed substrate 50 and second printed substrate 51. Thus, holder 55 is fixedly supported by the front case by screwing.

Boss 55n is formed at the central part of holder 55 so as to correspond to boss insertion hole 50a in first printed substrate 50. Boss 55n is formed on the vertical plate inside of holder 55 so as to extend in the substrate arraying direction. Screw 32 inserted through screw insertion hole 54a in ground substrate 54 is screwed to boss 55n. Thus, ground substrate 54 is fixedly supported by holder 55 by screwing.

First holding sections 55o are formed on holder 55 at positions near four corners so as to correspond to first holding section insertion holes 51b in second printed substrate 51. First holding sections 55o are formed into a columnar shape on the vertical plate inside of holder 55 so as to extend in the substrate arraying direction. First holding sections 55o extend near the back surface of first printed substrate 50 and near the surface of ground substrate 54 while being inserted through first holding section insertion holes 51b in second printed substrate 51.

First terminals 56 are fixed and held by upper-right and lower-left first holding sections 55o out of first holding sections 55o so as to extend in the substrate arraying direction. First terminals 56 have a configuration similar to the configuration of first terminal 33 in the second exemplary embodiment. Thus, first printed substrate 50, second printed substrate 51, and ground substrate 54 are kept separated from one another. First terminals 56 configured as described above electrically connect first electrode 21 and controller 40.

Second holding sections 55p are formed on holder 55 at positions near the upper-left corner and near the upper-right corner, respectively, so as to correspond to second terminal insertion holes 50e in first printed substrate 50. Second holding sections 55p are formed into a columnar shape on the vertical plate inside of holder 55 so as to extend in the substrate arraying direction. Second holding sections 55p extend near the back surface of first printed substrate 50 and near the surface of ground substrate 54 while being inserted through second holding section insertion holes 51g in second printed substrate 51.

Second terminal 57 is fixed and held by each second holding section 55p so as to extend in the substrate arraying direction. Second terminals 57 have a configuration similar to the configuration of first terminal 33 in the second exemplary embodiment. Thus, second terminals 57 have a function similar to first terminals 56. Second terminals 57 configured as described above electrically connect second electrode 22 and controller 40.

Third terminals 58 protrude from a position adjacently on the left side of left positioning boss 55c and a position adjacently on the right side of right positioning boss 55c at both lateral ends of the upper and lower side surfaces of holder 55 and from a position adjacently above upper positioning boss 55d and from a position adjacently below lower positioning boss 55d at both vertical ends of left and right side surfaces of holder 55. Third terminals 58 have a configuration similar to the configuration of second third terminals 37 in the second exemplary embodiment. Third terminals 58 are connected to third electrode 23 by soldering while being inserted through third terminal insertion holes 52a and 53a in third printed substrate 52 and fourth printed substrate 53. Third terminals 58 are also connected to third terminal insertion holes 54g in ground substrate 54 by soldering while being inserted through third terminal insertion holes 54g. Thus, third terminals 58 have a function similar to first terminals 56.

Third terminal insertion holes 54g are electrically connected to controller 40 by a copper foil pattern on the back surface of ground substrate 54. Third terminals 58 configured as described above electrically connect third electrode 23 and controller 40.

Fourth terminals 59 are formed on holder 55 at a position adjacently on the left side of upper-right first holding section 55o and at a position adjacently on the right side of lower-left first holding section 55o, respectively, so as to correspond to fourth terminal insertion holes 51c in second printed substrate 51. Fourth terminals 59 are formed on the vertical plate inside of holder 55 so as to extend in the substrate arraying direction. Fourth terminals 59 have a configuration similar to the configuration of fourth terminal 34 in the second exemplary embodiment. Thus, fourth terminals 59 have a function similar to first terminals 56. Fourth terminals 59 configured as described above electrically connect fourth electrode 24 and controller 40.

The connection state between controller 40 and first electrode 21 to fourth electrode 24 of electrostatic detection sensor 10 and the detection flow of electrostatic detection sensor 10 are the same as those in the second exemplary embodiment. Note that third electrode 23 on third printed substrate 52 and third electrode 23 on fourth printed substrate 53 are electrically connected to each other.

—Effect—

According to the above configuration, the present exemplary embodiment provides operations and effects same as those in the second exemplary embodiment described above.

In addition, third printed substrate 52 and fourth printed substrate 53 are perpendicularly disposed with respect to first printed substrate 50 while surrounding first printed substrate 50 as being separated from first printed substrate 50 as viewed from the substrate arraying direction, and third electrode 23 is formed on the surfaces of third printed substrate 52 and fourth printed substrate 53, whereby a change in capacitance, caused by water, at a portion near third electrode 23, that is, at a portion corresponding to the vicinity of the peripheral part of electrostatic detection sensor 10 on the surface of resin bumper 11, can be detected.

In the present exemplary embodiment, third flat surface 23a of third electrode 23 is perpendicular to second flat surface 22a of second electrode 22, that is, the surface of third printed substrate 52 and the surface of fourth printed substrate 53 are perpendicular to the surface of first printed substrate 50. However, the configuration is not limited thereto, and third flat surface 23a may have a predetermined angle larger than zero degree with respect to second flat surface 22a.

Other Exemplary Embodiments

In each of the above exemplary embodiments, first electrode 21 to fifth electrode 25 are formed from a copper foil pattern. However, they are not limited thereto, and some of or all of first electrode 21 to fifth electrode 25 may be formed from other conductive materials, for example.

In each of the above exemplary embodiments, first electrode 21, fourth electrode 24, and fifth electrode 25 have the shape described above. However, they are not limited thereto, and may have a circular shape or an elliptical shape, for example. The shape of second electrode 22 and third electrode 23 may also be changed according to the shape of first electrode 21, fourth electrode 24, and fifth electrode 25. It should be noted that second electrode 22 is disposed to be separated from first electrode 21 at substantially equal spaces.

In each of the above exemplary embodiments, second electrode 22 has a frame shape. However, it may have a shape in which a portion of a frame is eliminated, because second electrode 22 having such a shape provides a function almost equivalent to the function of second electrode 22 having a frame shape.

In the above second exemplary embodiment, third electrode 23 has a frame shape. However, it may have a shape in which a portion of a frame is eliminated, because third electrode 23 having such a shape provides a function almost equivalent to the function of third electrode 23 having a frame shape.

In each of the above exemplary embodiments, second electrode 22 is disposed to surround the entire periphery of first electrode 21. However, second electrode 22 may be disposed to surround a portion of the outer periphery of first electrode 21.

In the above second exemplary embodiment, third electrode 23 is disposed to surround the entire periphery of second electrode 22 or fourth electrode 24. However, third electrode 23 may be disposed to surround a portion of the outer periphery of second electrode 22 or fourth electrode 24.

In each of the above exemplary embodiments, electrostatic detection sensor 10 is mounted on a trunk door of a vehicle. However, it may be applied to components other than the trunk door. For example, electrostatic detection sensor 10 may be mounted to a door handle of a vehicle, or to various electronic devices other than vehicles. Electrostatic detection sensor 10 can detect, with high precision, an object that performs an operation even in a state of being exposed to water, whereby it is particularly effective to be used for a device which is likely to be splashed with water. For example, electrostatic detection sensor 10 may be mounted to home electric appliances such as washing machines, portable information communication devices or information terminal devices, various electronic devices such as cameras, or housing-related materials such as an entrance door knob.

In each of the above exemplary embodiments, an object that performs an operation for opening the trunk door is a finger. However, it may be a part of a human body other than a finger, such as a hand or elbow. In addition, even when the hands of the operator are full, the operator can open the trunk door, a sliding door, and the like with his/her foot. Further, the object may be a thing, other than a human body, that causes a change in a capacitance value of sensor body 31.

The components in the exemplary embodiments described above may be combined, as appropriate, without departing from the scope of the technology disclosed in the present specification.

INDUSTRIAL APPLICABILITY

As described above, the electrostatic detection sensor according to the technology disclosed in the present specification can improve the detection precision and is useful for vehicles and various electronic devices.

REFERENCE MARKS IN THE DRAWINGS

10: electrostatic detection sensor
11: resin bumper
11A: inner surface
12: metal body
20: front case
21: first electrode
21a: first flat surface
21b: first leg
22: second electrode
22a: second flat surface
22b: second leg
23: third electrode
23a: third flat surface (outer perimeter surface).
23b: third leg
23c: outer surface 24: fourth electrode
24a: fourth flat surface
24b: fourth leg
25: fifth electrode (ground electrode)
25a: fifth flat surface
25b: fifth leg
126: back case
127: first support member
128: second support member
129: control substrate
129a: first opening
129b: second opening
129c: third opening
129d: fourth opening
129e: fifth opening
31: sensor body
40: controller
41: control circuit
42: switching circuit
43: capacitance measurement circuit
26: first printed substrate (substrate, first substrate)
27: second printed substrate (substrate, second substrate, fourth electrode substrate)
28: ground substrate (substrate, fifth electrode substrate)
29: holder (fixing member)
29d: positioning boss (positioning section)
33 to 37: terminal
40: controller
50: first printed substrate (first substrate)
51: second printed substrate (fourth electrode substrate)
52: third printed substrate (second substrate)
53: fourth printed substrate (second substrate)
54: ground substrate (fifth electrode substrate)
55: holder (fixing member)
55a, 55c, 55d, 55e: positioning boss (positioning section)
56 to 59: terminal

The invention claimed is:

1. An electrostatic detection sensor comprising:
a sensor body which includes
a first electrode having a first flat surface,
a second electrode which has a second flat surface parallel to the first flat surface and is disposed to surround the first electrode while being separated from the first electrode, and
a third electrode which has an outer perimeter surface having a predetermined angle with respect to the second flat surface and is disposed to surround the second electrode while being separated from the second electrode; and
a controller connected to the first electrode, the second electrode, and the third electrode,
wherein the controller obtains, respectively:
a first intensity corresponding to capacitance between the first electrode and the second electrode by applying a first drive voltage to the first electrode and the second electrode while connecting the first electrode and the second electrode and keeping the third electrode open;
a second intensity corresponding to capacitance of the first electrode by applying a second drive voltage to the first electrode while connecting the second electrode and the third electrode to a ground potential; and
a third intensity corresponding to capacitance of the third electrode by applying a third drive voltage to the third electrode while connecting the first electrode to the ground potential and keeping the second electrode open, and determines whether an object approaches the sensor body based on a first computed value which is a computed temporal change in the first intensity, a second computed value which is a computed temporal change in the second intensity, and a third computed value which is a computed temporal change in the third intensity.

2. The electrostatic detection sensor according to claim 1, comprising a fifth electrode which has a fifth flat surface parallel to the first flat surface and is disposed to face a back surface of the first flat surface.

3. The electrostatic detection sensor according to claim 2, comprising a fourth electrode which has a fourth flat surface parallel to the fifth flat surface and is disposed between the first electrode and the fifth electrode,
wherein the controller obtains the first intensity while applying, to the fourth electrode, a waveform having a same potential and a same phase as potentials and phases of the first electrode and the second electrode.

4. The electrostatic detection sensor according to claim 1, wherein the sensor body has a substrate on which the first to third electrodes are formed, and a fixing member that fixedly supports the substrate.

5. The electrostatic detection sensor according to claim 4, wherein
the third electrode has a third flat surface parallel to the first flat surface,
the substrate includes:
a first substrate provided with the first to third electrodes formed on a surface of the first substrate; and
a second substrate which is disposed to be parallel to the first substrate while being separated from the first substrate and is provided with the third electrode formed on a surface of the second substrate so as to be overlapped with the third electrode on the first substrate, and
the third electrode on the first substrate and the third electrode on the second substrate are electrically connected to each other.

6. The electrostatic detection sensor according to claim 5, wherein the third electrode is also formed on a peripheral surface of the substrate.

7. The electrostatic detection sensor according to claim 5, wherein
the sensor body further includes:
a fifth electrode which has a fifth flat surface parallel to the first flat surface and is disposed on a back surface side of the first electrode so as to correspond to the first electrode; and
a fifth electrode substrate which is disposed to be parallel to the first substrate while being separated from the first substrate, and is provided with the fifth electrode formed on a surface of the fifth electrode substrate, and
the fixing member also fixedly supports the fifth electrode substrate.

8. The electrostatic detection sensor according to claim 7, wherein
the sensor body further includes:
a fourth electrode which has a fourth flat surface parallel to the fifth flat surface and is disposed between the first electrode and the fifth electrode, and
a fourth electrode substrate which is disposed to be parallel to the first substrate between the first substrate and the fifth electrode substrate while being separated from the first substrate and the fifth electrode substrate, and is provided with the fourth electrode formed on a surface of the fourth electrode substrate, the fixing member also holds the fourth electrode substrate, and the controller is also electrically connected to the fourth electrode, and obtains the first intensity by applying, to the fourth electrode, a voltage having a same potential and a same phase as potentials and phases of the first electrode and the second electrode.

9. The electrostatic detection sensor according to claim 4, wherein the third electrode has a third flat surface having a predetermined angle with respect to the second flat surface, and the substrate includes:
- a first substrate provided with the first electrode and the second electrode formed on a surface of the first substrate; and
- a second substrate which has a surface of the second substrate having the predetermined angle with respect to the surface of the first substrate, is disposed to surround the first substrate while being separated from the first substrate, and is provided with the third electrode formed on the surface of the second substrate.

10. The electrostatic detection sensor according to claim 4, further comprising a terminal for electrically connecting each of the first to third electrodes and the controller, wherein the terminal is fixedly held by the fixing member.

11. The electrostatic detection sensor according to claim 10, wherein the terminal has a shoulder part which is disposed to be in contact with the substrate and the fixing member.

12. The electrostatic detection sensor according to claim 4, further comprising a terminal for electrically connecting each of the first to third electrodes and the controller, wherein the terminal is formed from a material having a linear expansion coefficient substantially the same as linear expansion coefficients of the first to third electrodes.

13. The electrostatic detection sensor according to claim 4, wherein the fixing member is formed to extend in a thickness direction of the substrate, and has a positioning section for positioning the substrate with respect to the fixing member.

* * * * *